United States Patent
Chen et al.

(10) Patent No.: US 9,778,326 B2
(45) Date of Patent: Oct. 3, 2017

(54) CIRCUITS AND METHODS FOR LIMITING A SMALLEST SEPARATION OF THRESHOLDS IN A MAGNETIC FIELD SENSOR

(71) Applicant: Allegro Microsystems, LLC, Worcester, MA (US)

(72) Inventors: Michael Chen, Bedford, NH (US); Eric Burdette, Newmarket, NH (US); Devon Fernandez, Londonderry, NH (US); Steven E. Snyder, New Boston, NH (US); Jacob Harer, Nashua, NH (US)

(73) Assignee: Allegro MicroSystems, LLC, Worcester, MA (US)

( * ) Notice: Subject to any disclaimer, the term of this patent is extended or adjusted under 35 U.S.C. 154(b) by 0 days.

(21) Appl. No.: 14/626,963

(22) Filed: Feb. 20, 2015

(65) Prior Publication Data

US 2015/0260803 A1 Sep. 17, 2015

Related U.S. Application Data

(60) Provisional application No. 61/951,085, filed on Mar. 11, 2014.

(51) Int. Cl.

| G01R 33/00 | (2006.01) |
|---|---|
| G01R 33/07 | (2006.01) |
| G01R 33/09 | (2006.01) |
| G01D 5/14 | (2006.01) |
| G01D 5/244 | (2006.01) |

(52) U.S. Cl.
CPC ......... *G01R 33/0029* (2013.01); *G01D 5/147* (2013.01); *G01D 5/2448* (2013.01); *G01R 33/07* (2013.01); *G01R 33/09* (2013.01)

(58) Field of Classification Search
None
See application file for complete search history.

(56) References Cited

U.S. PATENT DOCUMENTS

| 875,733 A | 1/1908 | Poindexter |
|---|---|---|
| 4,185,265 A | 1/1980 | Griffin et al. |
| 4,293,814 A | 10/1981 | Boyer |
| 4,367,721 A | 1/1983 | Boyer |
| 4,374,333 A | 2/1983 | Avery |
| 4,443,716 A | 4/1984 | Avery |
| 4,476,901 A | 10/1984 | Sainen |

(Continued)

FOREIGN PATENT DOCUMENTS

| EP | 0 036 950 A1 | 10/1981 |
|---|---|---|
| EP | 0 602 697 A1 | 6/1994 |

(Continued)

OTHER PUBLICATIONS

U.S. Appl. No. 14/452,823, filed Aug. 6, 2014, Fernandez et. al.
(Continued)

*Primary Examiner* — Jermele M Hollington
*Assistant Examiner* — Douglas X Rodriguez
(74) *Attorney, Agent, or Firm* — Daly, Crowley, Mofford & Durkee, LLP

(57) ABSTRACT

A magnetic field sensor uses upper and lower thresholds. The upper and lower thresholds are limited such that they have a minimum separation distance between equivalent voltage levels of the upper and lower thresholds.

21 Claims, 13 Drawing Sheets

(56) References Cited

U.S. PATENT DOCUMENTS

| | | |
|---|---|---|
| 4,705,964 A | 11/1987 | Higgs |
| 4,906,928 A | 3/1990 | Gard |
| 4,992,731 A | 2/1991 | Lorenzen |
| 5,045,920 A | 9/1991 | Vig et al. |
| 5,103,171 A | 4/1992 | Petersen |
| 5,218,298 A | 6/1993 | Vig |
| 5,291,133 A | 3/1994 | Gokhal |
| 5,317,258 A | 5/1994 | Setzer et al. |
| 5,442,283 A | 8/1995 | Vig et al. |
| 5,459,398 A | 10/1995 | Hansen et al. |
| 5,477,142 A | 12/1995 | Good et al. |
| 5,493,219 A | 2/1996 | Makino et al. |
| 5,497,084 A | 3/1996 | Bicking |
| 5,510,706 A | 4/1996 | Good |
| 5,650,719 A | 7/1997 | Moody et al. |
| 5,694,038 A | 12/1997 | Moody et al. |
| 5,729,127 A | 3/1998 | Tamura et al. |
| 5,729,130 A | 3/1998 | Moody et al. |
| 5,781,005 A | 7/1998 | Vig et al. |
| 5,821,745 A | 10/1998 | Makino et al. |
| 5,917,320 A | 6/1999 | Scheller et al. |
| 6,091,239 A | 7/2000 | Vig et al. |
| 6,100,680 A | 8/2000 | Vig et al. |
| 6,242,908 B1 | 6/2001 | Scheller et al. |
| 6,297,627 B1 | 10/2001 | Towne et al. |
| 6,492,821 B1 | 12/2002 | Marko et al. |
| 6,525,531 B2 | 2/2003 | Forrest et al. |
| 6,690,155 B2 | 2/2004 | Vig et al. |
| 6,815,944 B2 | 11/2004 | Vig et al. |
| 6,919,720 B2 | 7/2005 | Vig et al. |
| 7,026,808 B2 | 4/2006 | Vig et al. |
| 7,138,793 B1 | 11/2006 | Bailey |
| 7,199,579 B2 | 4/2007 | Scheller et al. |
| 7,253,614 B2 | 8/2007 | Forrest et al. |
| 7,362,094 B2 | 4/2008 | Voisine et al. |
| 7,365,530 B2 | 4/2008 | Bailey et al. |
| 7,368,904 B2 | 5/2008 | Scheller et al. |
| 7,548,056 B2 | 6/2009 | Voisine et al. |
| 7,592,801 B2 | 9/2009 | Bailey et al. |
| 7,619,406 B2 | 11/2009 | Voisine et al. |
| 7,622,914 B2 | 11/2009 | Bailey et al. |
| 7,772,838 B2 | 8/2010 | Bailey et al. |
| 8,058,864 B2 | 11/2011 | Scheller et al. |
| 8,089,270 B2 | 1/2012 | Scheller et al. |
| 8,450,996 B2 | 5/2013 | Foletto et al. |
| 8,598,867 B2 | 12/2013 | Foletto et al. |
| 8,624,588 B2 | 1/2014 | Vig et al. |
| 8,723,512 B1 | 5/2014 | Burdette et al. |
| 2001/0033159 A1* | 10/2001 | Forrest ............... G01D 5/244 324/207.2 |
| 2011/0298447 A1* | 12/2011 | Foletto ............... G01D 5/145 324/207.2 |
| 2012/0223704 A1* | 9/2012 | Hayashi ............ G01R 33/0023 324/244 |
| 2012/0249126 A1 | 10/2012 | Friedrich et al. |
| 2012/0280681 A1 | 11/2012 | David et al. |
| 2013/0320970 A1 | 12/2013 | Foletto et al. |
| 2014/0062463 A1 | 3/2014 | Foletto et al. |
| 2014/0195186 A1 | 7/2014 | Carbonne et al. |
| 2014/0222364 A1 | 8/2014 | Foletto et al. |
| 2014/0266176 A1 | 9/2014 | Fernandez et al. |

FOREIGN PATENT DOCUMENTS

| | | |
|---|---|---|
| EP | 0 621 460 A1 | 10/1994 |
| EP | 0 875 733 A2 | 11/1998 |
| EP | 0 875 733 A3 | 11/1998 |
| EP | 0 875 774 A2 | 11/1998 |
| GB | 2 309 311 A | 7/1997 |
| WO | WO 00/57136 | 9/2000 |

OTHER PUBLICATIONS

U.S. Appl. No. 14/599,789, filed Jan. 19, 2015, Feucht. et. al.
U.S. Appl. No. 14/600,826, filed Jan. 20, 2015, Fernandez et. al.
Allegro Data Sheet; "ATS612LSB Dynamic, Self-Calibrating, Peak-Detecting, Differential Hall-Effect Gear-Tooth Sensor;" Sep. 6, 1996; 16 sheets.
Allegro Data Sheet; "ATS630, ATS631 True Power on Zero Speed Gear Tooth Sensor Sub-assembly with Adaptive Thresholds;" undated; 8 sheets.
Allegro Data Sheet; ATS630LSA and ATS631LSA Zero-Speed, Self-Calibrating, Hall-Effect Gear-Tooth True Power-On Sensors; Oct. 28, 1996; 12 sheets.
Datel Intersil; Data Aquisition and Conversion Handbook, A Technical Guide, A/D and D/A Converting and their Applications; Jan. 1980; 3 sheets.
Fletcher; "An Engineering Approach to Digital Design;" Prentice Hall, Inc., Englewood Cliffs, NJ; Jan. 1980; 2 sheets.
Graeme et al.; "Operational Amplifiers Design ad Applications;" McGraw-Hill Book Company; Jun. 1, 1974; 3 sheets.
Motorola; "Linear/Interface Integrated Circuits;" Series D, Motorola Inc.; Jan. 1983; 2 sheets.
Acceptance of 312 Amendment; dated Jun. 28, 1999; for U.S. Appl. No. 08/847,703; 3 sheets.
Rule 32 C.F.R §1.312(a) Amendment; dated Dec. 17, 1998; for U.S. Appl. No. 08/847,703; 4 sheets.
Notice of Allowability; date illegible; for U.S. Appl. No. 08/847,703; 4 sheets.
Response with Terminal Disclaimer; filed Sep. 14, 1998; for U.S. Appl. No. 08/847,703; 5 sheets.
Office Action; dated Jun. 26, 1998; for U.S. Appl. No. 08/847,703; 6 sheets.
Notice of Allowance; dated Jan. 26, 2001; for U.S. Appl. No. 09/275,209; 9 pages.
Response with Terminal Disclaimer; filed Dec. 5, 2000; for U.S. Appl. No. 09/275,209; 6 pages.
Office Action; dated Sep. 27, 2000; for U.S. Appl. No. 09/275,209; 4 pages.
Notice of Allowance; dated Aug. 26, 2002; for U.S. Appl. No. 09/859,093; 11 pages.
Response with Terminal Disclaimer; filed May 28, 2002; for U.S. Appl. No. 09/859,093; 7 pages.
Office Action; dated May 7, 2002; for U.S. Appl. No. 09/859,093; 4 pages.
PCT International Search Report and Written Opinion of the ISA dated Sep. 14, 2015; for PCT Pat. App. No. PCT/US2015/016741; 14 pages.
International Preliminary Report on Patentability dated Sep. 22, 2016 for PCT Application No. PCT/US2015/016741; 11 pages.
Reply to Official Communication filed on Mar. 31, 2017 for EP Pat. Appl. No. 15730879.2; 4 pages.
Amended Claims for Reply to Official Communication filed Mar. 31, 2017 for EP Pat. Appl. No. 15730879.2; 5 pages.

* cited by examiner

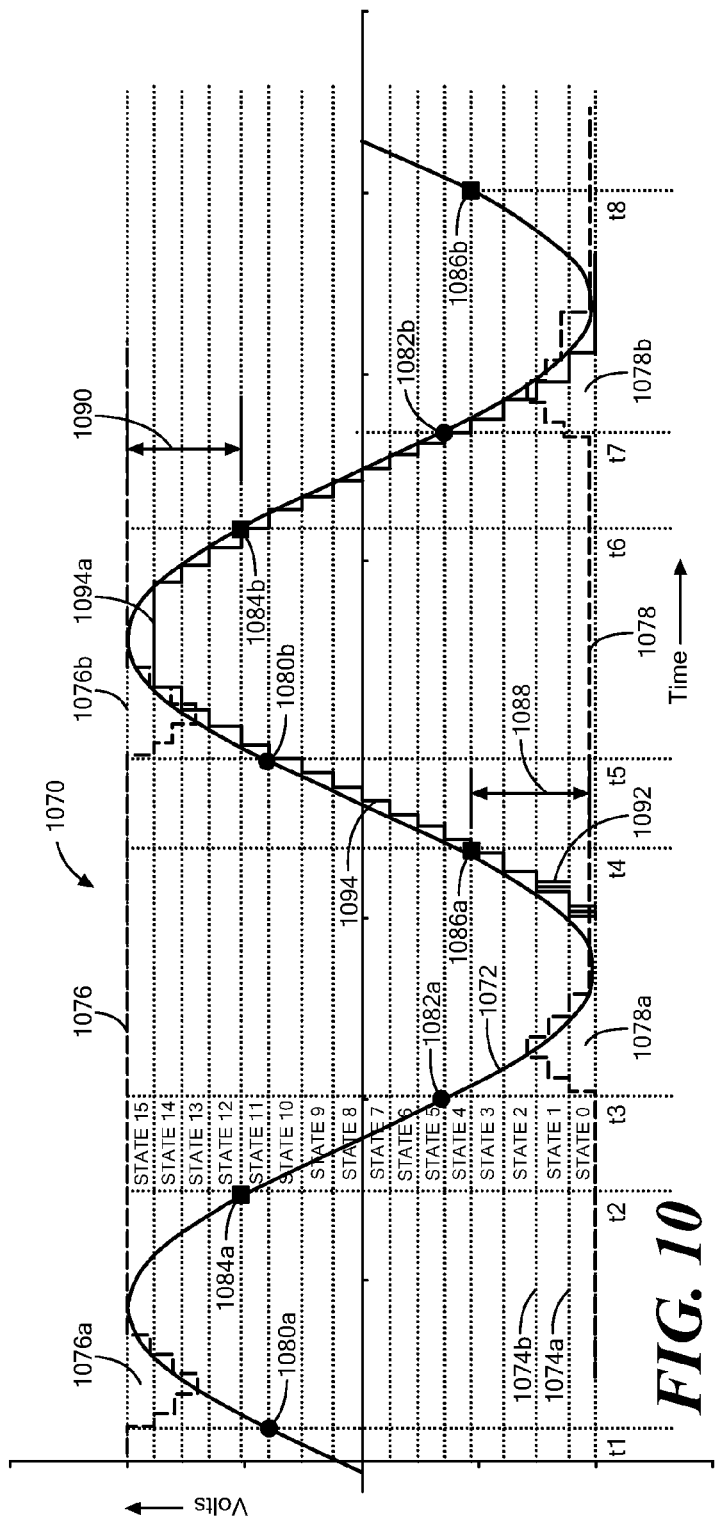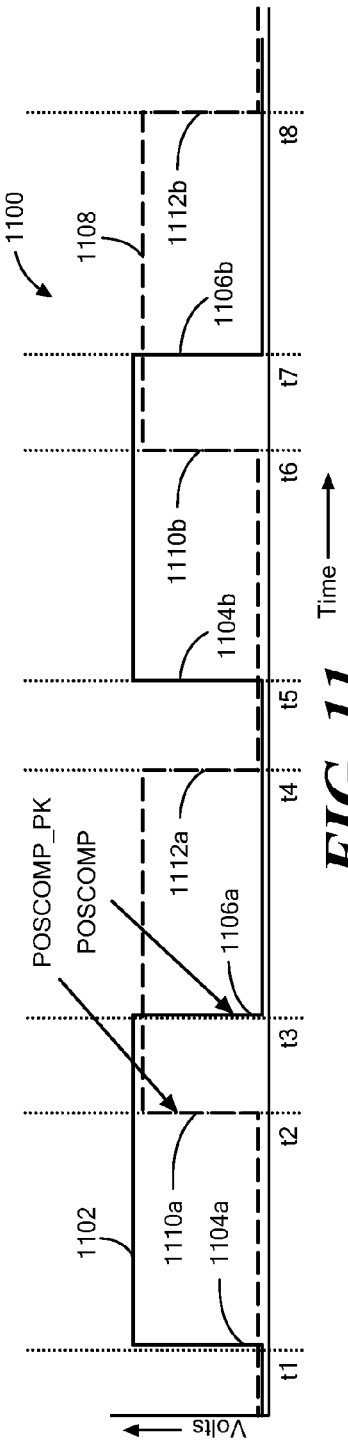
FIG. 10
FIG. 11

CIRCUITS AND METHODS FOR LIMITING A SMALLEST SEPARATION OF THRESHOLDS IN A MAGNETIC FIELD SENSOR

CROSS REFERENCE TO RELATED APPLICATIONS

This application claims the benefit under 35 U.S.C. §119(e) of U.S. Provisional Application No. 61/951,085, filed Mar. 11, 2014, which application is incorporated herein by reference in its entirety.

STATEMENT REGARDING FEDERALLY SPONSORED RESEARCH

Not Applicable.

FIELD OF THE INVENTION

This invention relates generally to magnetic field sensors, and, more particularly, to circuits and methods for generating thresholds used in magnetic field sensors.

BACKGROUND

Magnetic field sensors (e.g., rotation detectors) for detecting ferromagnetic articles and/or magnetic articles are known. The magnetic field associated with the ferromagnetic article or magnetic article is detected by a magnetic field sensing element, such as a Hall element or a magnetoresistance element, which provides a signal (i.e., a magnetic field signal) proportional to a detected magnetic field. In some arrangements, the magnetic field signal is an electrical signal.

The magnetic field sensor processes the magnetic field signal to generate an output signal that, in some arrangements, changes state each time the magnetic field signal crosses thresholds, either near to peaks (positive and/or negative peaks) or near to some other level, for example, zero crossings of the magnetic field signal. Therefore, the output signal has an edge rate or period indicative of a speed of rotation of the ferromagnetic (e.g., ferrous) or magnetic object, for example, a gear or a ring magnet (either of which may or may not be ferrous).

One application for a magnetic field sensor is to detect the approach and retreat of each tooth of a rotating ferromagnetic gear, either a hard magnetic gear or a soft ferromagnetic gear. In some arrangements, the gear is disposed proximate to a stationary magnet, which can form a part of a magnetic field sensor, and the magnetic field sensor is responsive to perturbations of a magnetic field as the gear rotates. Such arrangements are also referred to as proximity sensors or motion sensors. In other arrangements, a ring magnet having magnetic regions (permanent or hard magnetic material) with alternating polarity is coupled to the ferromagnetic gear or is used by itself and the magnetic field sensor is responsive to approach and retreat of the magnetic regions of the ring magnet. In the case of sensed rotation, the arrangements can be referred to as rotation sensors.

In one type of magnetic field sensor, sometimes referred to as a peak-to-peak percentage detector (or, more simply, threshold detector), one or more threshold levels are equal to respective percentages of the peak-to-peak magnetic field signal. One such threshold detector is described in U.S. Pat. No. 5,917,320 entitled "Detection of Passing Magnetic Articles While Periodically Adapting Detection Threshold," issued Jun. 29, 1999, and assigned to the assignee of the present invention.

Another type of magnetic field sensor, sometimes referred to as a slope-activated detector (or peak-referenced detector, or, more simply, a peak detector), is described in U.S. Pat. No. 6,091,239 entitled "Detection Of Passing Magnetic Articles With a Peak Referenced Threshold Detector," issued Jun. 18, 2000, and also assigned to the assignee of the present invention. In the peak detector, the threshold levels differ from the positive and negative peaks (i.e., the peaks and valleys) of the magnetic field signal by a predetermined amount. Thus, in this type of magnetic field sensor, the output signal changes state when the magnetic field signal comes away from a peak or valley of the magnetic field signal by the predetermined amount.

It should be understood that the above-described threshold detector and the above-described peak detector both have circuitry that can identify the positive and negative peaks of a magnetic field signal. The threshold detector and the peak detector, however, each use the detected peaks in different ways.

In order to accurately detect the positive and negative peaks of a magnetic field signal, the magnetic field sensor is capable of tracking at least part of the magnetic field signal. To this end, typically, one or more digital-to-analog converters (DACs) can be used to generate a tracking signal, which tracks the magnetic field signal. For example, in the above-referenced U.S. Pat. Nos. 5,917,320 and 6,091,239, two DACs are used, one (PDAC) to detect the positive peaks of the magnetic field signal and the other (NDAC) to detect the negative peaks of the magnetic field signal.

The magnetic field associated with the ferromagnetic object and the resulting magnetic field signal are proportional to the distance between the ferromagnetic object, for example the rotating ferromagnetic gear, and the magnetic field sensing element(s), for example, the Hall elements, used in the proximity detector. This distance is referred to herein as an "air gap." As the air gap increases, the magnetic field sensing elements tend to experience a smaller magnetic field from the rotating ferromagnetic gear, and therefore smaller changes in the magnetic field generated by passing teeth of the rotating ferromagnetic gear.

Proximity detectors have been used in systems in which the ferromagnetic object (e.g., the rotating ferromagnetic gear) not only rotates, but also vibrates. For the ferromagnetic gear capable of rotation about an axis of rotation in normal operation, the vibration can have at least two vibration components. A first vibration component corresponds to a "rotational vibration," for which the ferromagnetic gear vibrates back and forth about its axis of rotation. A second vibration component corresponds to "translational vibration," for which the above-described air gap dimension vibrates. The rotational vibration and the translational vibration can occur even when the ferromagnetic gear is not otherwise rotating in normal operation. Both the first and the second vibration components, separately or in combination, can generate an output signal from the proximity detector that indicates rotation of the ferromagnetic gear even when the ferromagnetic gear is not rotating in normal operation.

Proximity detectors adapted to detect and to be responsive to rotational vibration and translational vibration are described, for example, in U.S. Pat. No. 7,365,530, issued Apr. 29, 2008, U.S. Pat. No. 7,592,801, issued Sep. 22, 2009, U.S. Pat. No. 7,622,914, issued Nov. 24, 2009, U.S. Pat. No. 7,253,614, issued Aug. 7, 2007, and U.S. patent application Ser. No. 12/338,048, filed Dec. 18, 2008, each of which are assigned to the assignee of the present invention.

Proximity detectors have been applied to automobile antilock brake systems (ABS) to determine rotational speed of automobile wheels. Proximity detectors have also been applied to automobile transmissions to determine rotating speed of transmission gears in order to shift the transmission at predetermined shift points and to perform other automobile system functions.

It will be understood that many mechanical assemblies have size and position manufacturing tolerances. For example, when the proximity detector is used in an assembly, the air gap can have manufacturing tolerances that result in variation in magnetic field sensed by the magnetic field sensing elements used in the proximity detector when the ferromagnetic object is rotating in normal operation and a corresponding variation a magnitude of the magnetic field signal. It will also be understood that the air gap can change over time as wear occurs in the mechanical assembly.

Due to noise (electrical or vibrational) the motion sensor may not accurately position edges of an output signal.

For either the peak detector or for the threshold detector, it will be understood that a comparator used to generate a final two state output signal indicative of a speed of rotation of an object are influenced by electrical noise. In particular, where a magnetic field signal and window thresholds are presented to input terminals of a comparator, if the window thresholds are below the noise level, false state changes at the output of the comparator can occur. As described above, for a threshold type detector, the window thresholds are fixed percentages of a peak-to-peak magnitude of the magnetic field signal. Thus, for a smaller magnetic field signal, the window threshold can be within the noise level.

Thus, it would be desirable to have a threshold detector for which calculated thresholds are not within a noise level of a magnetic field sensor.

SUMMARY

The present invention provides a threshold detector for which calculated thresholds are not allowed to move to be within a noise level of a magnetic field sensor.

In accordance with an example useful for understanding an aspect of the present invention, a magnetic field sensor includes at least one magnetic field sensing element configured to generate a magnetic field signal influenced by a ferromagnetic object. The magnetic field sensor also includes peak finding circuitry operable to identify at least one of a positive peak value or a negative peak value of the magnetic field signal. The magnetic field sensor also includes a threshold generation module coupled to receive the at least one of the positive peak value or the negative peak value. The threshold generation module includes a peak-to-peak calculation module operable to determine a peak-to-peak value by using the at least one of the positive peak value or the negative peak value. The threshold generation module also includes a threshold calculation module operable to determine an upper threshold value and a lower threshold value based on the peak-to-peak value. The upper threshold value is a first predetermined percentage of the peak-to-peak value and the lower threshold value is a second lower predetermined percentage of the peak-to-peak value. The threshold generation module also includes a threshold limiting module operable to identify an equivalent voltage difference between the upper threshold value and the lower threshold value, and, if the difference is too small, operable to set the difference between the upper threshold value and the lower threshold value to a value in accordance with a predetermined equivalent voltage difference value.

In accordance with an example useful for understanding another aspect of the present invention, a method of sensing a magnetic field includes generating a magnetic field signal influenced by a ferromagnetic object with at least one magnetic field sensing element. The method also includes identifying at least one of a positive peak value or a negative peak value of the magnetic field signal. The method also includes determining a peak-to-peak value by using the at least one of the positive peak value or the negative peak value. The method also includes determining an upper threshold value and a lower threshold based on the peak-to-peak value, wherein the upper threshold value is a first predetermined percentage of the peak-to-peak value and the lower threshold value is a second lower predetermined percentage of the peak-to-peak value. The method also includes identifying an equivalent voltage difference between the upper threshold value and the lower threshold value, and if the equivalent voltage difference is too small, the method also includes setting an equivalent voltage difference between the upper threshold value and the lower threshold value to a predetermined equivalent voltage difference value.

In accordance with an example useful for understanding another aspect of the present invention, a non-transitory computer-readable storage medium having computer readable code thereon, includes instructions for determining a peak-to-peak value by using the at least one of a positive peak value or the negative peak value of a magnetic field signal generated by at least one magnetic field sensing element; instructions for determining an upper threshold value and a lower threshold based on the peak-to-peak value, wherein the upper threshold value is a first predetermined percentage of the peak-to-peak value and the lower threshold value is a second lower predetermined percentage of the peak-to-peak value; instructions for identifying an equivalent voltage difference between the upper threshold value and the lower threshold value; and instructions for, if the equivalent voltage difference is too small, setting the equivalent voltage difference between the upper threshold value and the lower threshold value to a predetermined equivalent voltage difference value.

BRIEF DESCRIPTION OF THE DRAWINGS

The foregoing features of the invention, as well as the invention itself may be more fully understood from the following detailed description of the drawings, in which:

FIG. 10 is a graph showing a magnetic field signal and associate states;

FIG. 11 is a graph showing a POSCOMP signal and a POSCOMP_PK signal generated in accordance with states of the magnetic field signal of FIG. 10;

DETAILED DESCRIPTION

Figure 1:
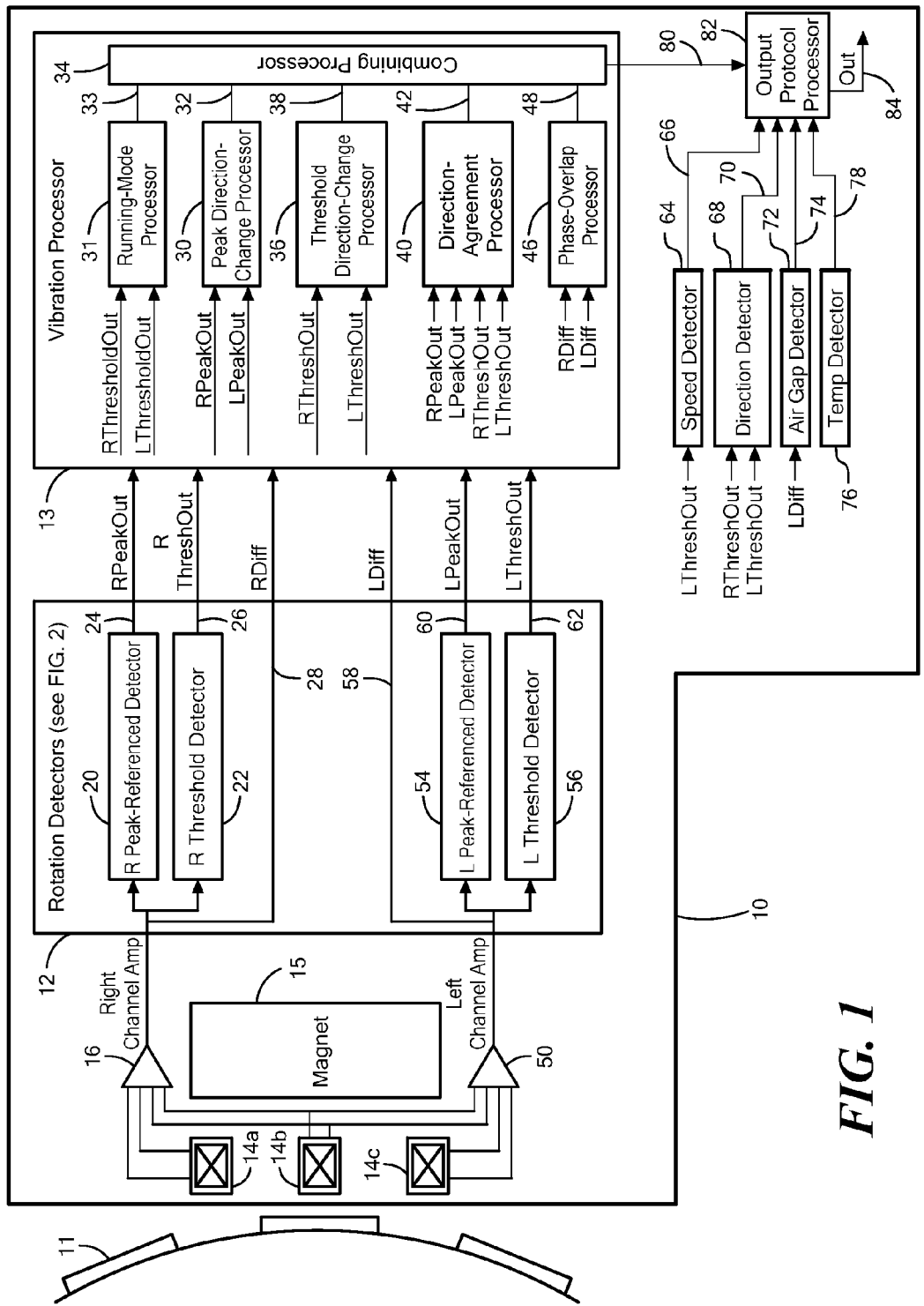
FIG. 1 is a block diagram showing an example of a magnetic field sensor having rotation detectors.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuit shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

The terms "parallel" and "perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

Threshold detectors are described with particularity herein. The threshold detectors described herein are adaptive and adjust upper and lower thresholds in accordance with a magnitude of a magnetic field signal. However, if a peak-to-peak value of the magnetic field signal is too small, a difference between the upper and the lower thresholds is kept to be at least a predetermined difference, and the upper and the lower thresholds are not allowed to move closer together when the magnetic field signal is still smaller.

While various signals (including thresholds) and various values (including threshold values) are described herein as voltages, it will be understood that it is possible to design circuits for which some of or all of the various signals (including thresholds) and various values (including threshold values) are instead currents.

Referring to FIG. 1, an example of a magnetic field sensor 10 is similar to the magnetic field sensor 600 shown in FIG. 11 of U.S. Pat. No. 7,772,838, issued Aug. 10, 2010, which is also similar to and substantially described in conjunction with FIG. 1 of U.S. Pat. No. 7,772,838.

However, in the magnetic field sensor 10 in FIG. 1 of the present application, not shown in U.S. Pat. No. 7,772,838, a magnet 15 can provide back biasing of three magnetic field sensing elements 14a, 14b, 14c. The magnetic field sensor 10 includes rotation detectors 12, which include a right channel peak-referenced (i.e., peak) detector 20 and a left channel peak referenced (i.e., peak) detector 54. The rotation detectors 12 also include a right channel threshold detector 22 and a left channel threshold detector 56.

As described below in conjunction with FIG. 2, the threshold detectors 22, 56 can have characteristics that are not described in U.S. Pat. No. 7,772,838, but which are described more fully below.

First, generally describing elements of the magnetic field sensor 10, a plurality of magnetic field sensing elements 14a-14c is arranged for generating an RDIFF signal 28 proportional to a magnetic field at a first location relative to an object 11 and an LDIFF signal 58 proportional to a magnetic field at a second location relative to the object 11. As described more fully below, the first and second locations correspond to right and left channels. The object 11 (also referred to as a target object 11 herein) can be an object configured to rotate, for example, a ferromagnetic gear 11, which, in addition to rotation in normal operation, is also subject to undesirable rotational and translational vibrations. The magnetic field sensor 10 includes a right channel amplifier 16 providing the RDIFF signal 28 and a left channel amplifier 50 providing the LDIFF signal 58.

The magnetic field sensor 10 also includes rotation detectors 12, including at least two rotation detectors in the form of at least one of a right channel threshold detector 22 or a right channel peak-referenced detector 20, and at least one of a left channel threshold detector 56 or a left channel peak-referenced detector 54.

The right channel threshold detector 22 is responsive to the RDIFF signal 28 and provides a first output signal 26 (RThreshOut) indicative of a rotation of the object. The left channel threshold detector 56 is responsive to the LDIFF signal 58 and provides a second output signal 62 (LThreshOut) also indicative of the rotation of the object. The right channel peak-referenced detector 20 is responsive to the RUFF signal 28 and provides a third output signal 24 (RPeakOut) further indicative of the rotation of the object. The left channel peak-referenced detector 54 is responsive to the LDIFF signal 58 and provides a fourth output signal 60 (LPeakOut) still further indicative of the rotation of the object.

The signals 24, 26, 60, 62 can be two state signals for which state transitions are indicative of passing ones of the teeth of the gear 11, more particularly, passing ones of edges of the teeth of the gear.

The designations "left" and "right" (also L and R, respectively) are indicative of physical placement of the magnetic field sensing elements 14a-14c relative to the object 11 and correspond to left and right channels, where a channel contains the signal processing circuitry associated with the respective magnetic field sensing element(s). For example, the magnetic field sensing elements 14a, 14b differentially sense the magnetic field at a location to the right of the object 11 and the right channel contains circuitry for processing the magnetic field thus sensed (e.g., right channel amplifier 16, R Peak-referenced detector 20, and R threshold detector 22).

In the illustrative embodiment, three magnetic field sensing elements axe used for differential magnetic field sensing, with the central sensor 14b used in both channels. While three magnetic field sensing elements 14a-14c are shown, it should be appreciated that two or more magnetic field sensing elements can be used. For example, in an embodiment using only two magnetic field sensing elements 14a, 14c, the magnetic field sensing element 14a can be coupled to the right channel amplifier 16 and the magnetic field sensing element 14c can be coupled to the left channel amplifier 50.

The right channel includes magnetic field sensing elements 14a and 14b, the right channel amplifier 16, the right channel peak-referenced detector 20, and the right channel threshold detector 22. The left channel includes magnetic field sensing elements 14b and 14c the left channel amplifier 50, the left channel peak-referenced detector 54, and the left channel threshold detector 56. It will be appreciated that right and left are relative terms, and, if reversed, merely result a relative phase change in the RDIFF and LDIFF signals 28, 58, respectively.

The magnetic field sensor 10 also includes a vibration processor 13 responsive to output signals from at least two of the rotation detectors 20, 22, 54, 56 for detecting the vibration of the object 11. The vibration processor 13 includes at least one of a running-mode processor 31, a peak direction-change processor 30, a threshold direction-change processor 36, a direction-agreement processor 40, and a phase-overlap processor 46. In one particular embodiment, the vibration processor 13 contains the threshold direction-change processor 36, the direction-agreement processor 40, and the phase-overlap processor 46.

The running mode processor 31, the threshold direction-change processor, the peak direction-change processor 30, the threshold direction-change processor 36, the direction-agreement processor, and the phase-overlap processor 46 are not described in detail herein, but are described in U.S. Pat. No. 7,772,838 However, let it suffice here to say that running-mode processor 31 is configured to detect the vibration of the object 11 and to generate a running-mode output signal 33 in response to the vibration. The peak direction-change processor 30 and the threshold direction-change processor 36 are configured detect the vibration of the object 11 and to generate respective direction-change output signals 32, 38 in response to the vibration. The direction-agreement processor 40 is configured to detect the vibration of the object 11 and to generate a direction-agreement output signal 42 in response to the vibration. The phase-overlap processor 46 is also configured to detect the vibration of the object 11 and to generate a phase-overlap output signal 48 in response to the vibration.

A combining processor 34 is configured to logically combine at least two of the running-mode output signal 33, the direction-change output signal 38, the direction-change output signal 32, the direction-agreement output signal 42, and the phase-overlap output signal 48 to provide a vibration-decision output signal 80 indicative of whether or not the object 11 is vibrating. For example, in one particular embodiment, the logical combining is an OR function providing that if any of running-mode output signal 33, the direction-change output signal 38, the direction-change output signal 32, the direction-agreement output signal 42, or the phase-overlap output signal 48 indicates a vibration of the object, then the vibration-decision output signal 80 indicates the vibration accordingly, for example, as a high logic state.

However, in an alternate arrangement, the magnetic field sensor 10 has one vibration processor, selected from among the running-mode processor 31, the peak-direction change processor 30, the threshold direction-change processor 36, the direction-agreement processor 40, and the phase-overlap processor 46, the selected one of which provides the vibration decision output signal 80.

The threshold direction-change processor 38, the peak direction-change processor 30, the direction-agreement processor 40, and the phase-overlap processor 46 can detect rotational vibration of the rotating object 11, for example, the rotating ferromagnetic gear 11 described above. The phase-overlap processor 46 can detect translational vibration of the object 11 and/or of the magnetic field sensing elements 14a-14c. However, in other embodiments, any of the above-identified processors can be configured to detect either the rotational vibration or the translational vibration or both.

The magnetic field sensor 10 can also include one or more of a speed detector 64 to detect a rotational speed of the object 11 and provide a corresponding speed output signal 66 indicative of a speed of rotation of the object 11, a direction detector 68 to detect a direction of rotation of the object 11 and provide a corresponding direction output signal 70 indicative of the direction of rotation of the object 11, an air gap detector 72 to detect an air gap between one or more of the magnetic field sensing elements 14a-14c and the ferromagnetic object 11 and provide a corresponding air gap output signal 74 indicative of the air gap, and a temperature detector 76 to detect a temperature and provide a corresponding temperature output signal 78 indicative of the temperature.

An output protocol processor 82 is responsive to one or more of the output signals 66, 70, 74, 78 and to the vibration-decision output signal 80 for generating a sensor output signal 84 in accordance with the received signals. In one particular embodiment, for example, the output signal 84 has a first characteristic when the vibration-decision output signal 80 indicates a vibration, and a second characteristic when the vibration-decision output signal 80 indicates no vibration. For example, in one particular embodiment, the output signal 84 can be static (i.e., statically high or low) when the vibration-decision output signal 80 indicates the vibration, and can be active (e.g., an AC waveform having a frequency proportional to the speed output signal 66) when the vibration-decision output signal 80 indicates no vibration. In other embodiments, the output protocol processor 82 provides an encoded output signal 84 in accordance with one of more or output signals 66, 70, 74, 78, 80.

In other embodiments, there is only one channel, e.g., the right channel. In these embodiments, either two magnetic field sensing elements, e.g., 14a, 14b, can be used in a differential arrangement, or only one magnetic field sensing element can be used.

In other embodiments, the magnetic field sensing elements are magnetoresistance elements, either used individually or in H-bridges. Again, there can be only one channel when magnetoresistance elements are used.

In some embodiments, a Hall element is used in one channel and a magnetoresistance element is used in the other channel, each having a different sensitivity. This arrangement can provide a magnetic field sensor with two different operating ranges, or with an extended operating range, wider than either of the two channels alone.

In other embodiments, there is no vibration processor.

In other embodiments there is no speed detector, and/or no direction detector, and/or no air gap detector, and/or no temperature detector, and/or no output protocol processor.

Figure 2:
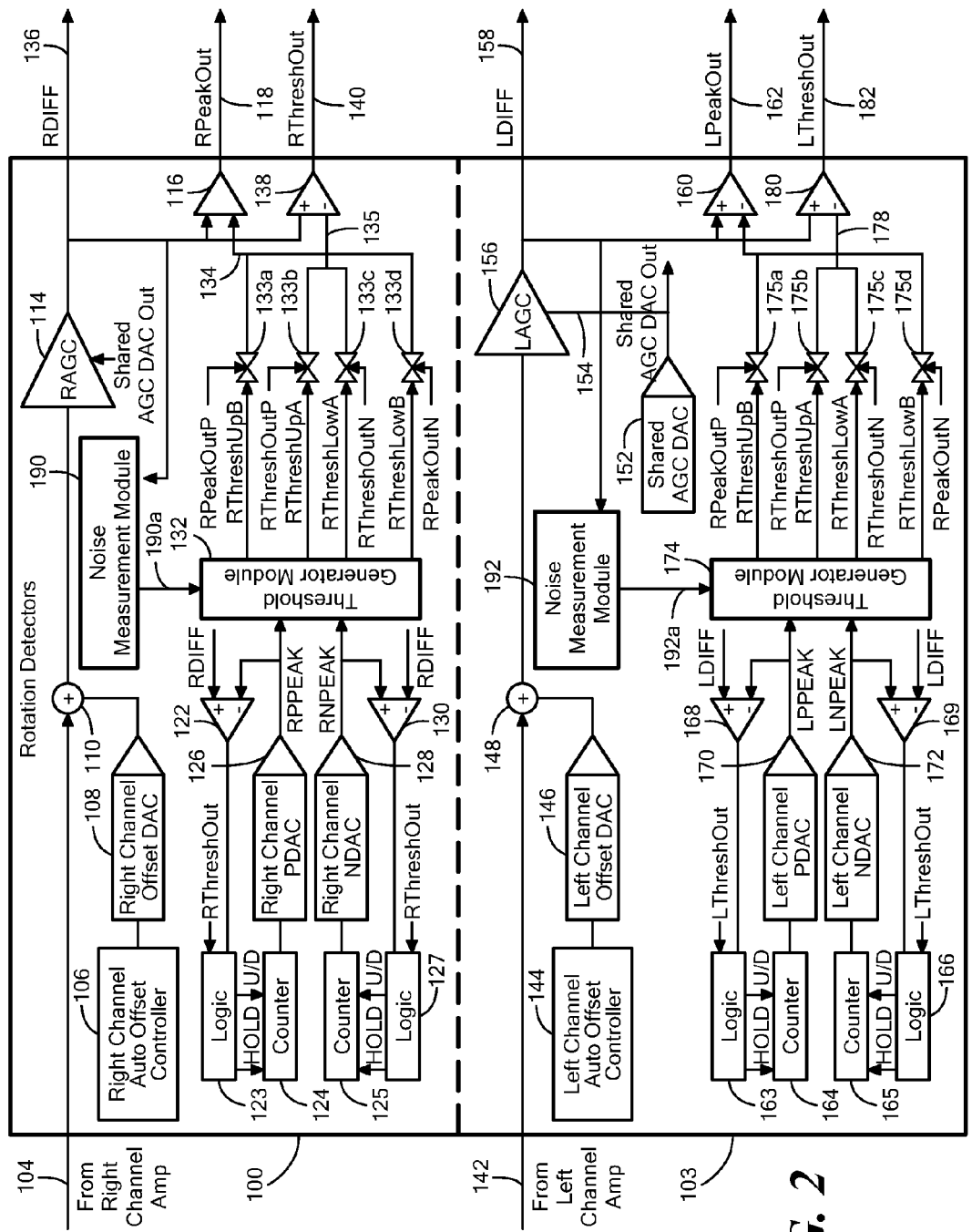
FIG. 2 is a block diagram showing rotation detectors that may be used in the magnetic field sensor of FIG. 1, the rotation detectors having respective threshold generation modules.

Referring now to FIG. 2, rotation detectors 100 are the same as or similar to the rotation detectors 12 of FIG. 1. The rotation detectors 100 include a right channel rotation detector 101 and a left channel rotation detector 103. The rotation detectors 100 are similar to and substantially described in conjunction with FIG. 2 of U.S. Pat. No. 7,772,838.

Taking the rotation detector 101 as representative of the rotation detector 103, only the rotation detector 101 is discussed. The rotation detector 101 includes circuitry to generate an RPPEAK signal having value representative of positive peaks of an RDIFF signal 136 and an RNPEAK signal having values representative of negative peaks of the RDIFF signal 136. Operation of such exemplary circuitry is described in U.S. Pat. No. 7,772,838.

The rotation detectors 100 can correspond to the rotation detectors 12 of FIG. 1. A right channel 101 corresponds to an upper half of FIG. 2 and a left channel 103 corresponds to a lower half of FIG. 2. It will be appreciated that the left channel has characteristics similar to the right channel. For simplicity, only the right channel is described herein.

An input signal 104 from a right channel amplifier, e.g., the right channel amplifier 16 of FIG. 1, can include an undesirable DC offset. A right channel auto offset controller 106, a right channel offset digital-to-analog converter (DAC) 108 and a summer 110 are can eliminate the DC offset by known techniques. A right channel automatic gain controller (RAGC) 114 provides an RDIFF signal 136 having an amplitude within a predetermined amplitude range. Control of the RAGC 114 is further described below. It should be understood that the RDIFF signal 136 is representative of the magnetic field experienced by one or more magnetic field sensing elements, for example, the magnetic field sensing elements 14a, 14b of FIG. 1.

The RDIFF signal 136 is provided to a right channel peak (RPeak) comparator 116 and to a right channel threshold (RThresh) comparator 138. The RPeak comparator 116 also receives a threshold voltage 134 and the RThresh comparator 138 receives a threshold voltage 135.

The threshold voltage 134 switches between two values, a first one of which is a first predetermined percentage below a positive peak of the RDIFF signal 136 and a second one of which is a second predetermined percentage above a negative peak of the RDIFF signal 136. In one particular embodiment, the first and second predetermined percentages are each about fifteen percent. The first threshold voltage 134 is, therefore, relatively near to and below a positive peak of the RDIFF signal 136 or relatively near to and above a negative peak of the RDIFF signal 136. Therefore, the RPeak comparator 116 generates an RPeakOut signal 118 having edges closely associated with the positive and negative peaks of the RDIFF signal 136.

The threshold voltage 135 also switches between two values, a first one of which is a first predetermined percentage of the peak-to-peak amplitude of the RDIFF signal 136 and a second one of which is a second predetermined percentage of the peak-to-peak amplitude of the RDIFF signal 136. In one particular embodiment, the first predetermined percentage is about sixty percent and the second predetermined percentage is about forty percent of the peak-to-peak amplitude of the RDIFF signal 136. Therefore, the RThresh comparator 138 generates an RThreshOut signal 140 having edges relatively closely associated with a midpoint, or fifty percent point, between the positive peak and the negative peak of the RDIFF signal 136.

The threshold voltages 134, 135 are generated by counters 124, 125, logic circuits 123, 127, a right channel PDAC 126, a right channel NDAC 128, comparators 122, 130, a threshold generation module 132, and transmission gates 133a-133d. The comparator 122 receives the RDIFF signal 136 and an output from the right channel PDAC 126, and, by way of feedback provided by the logic circuit 123 and the counter 124, causes the output of the PDAC 126 (i.e., the PDAC voltage) to track and hold the positive peaks of the RDIFF signal 136. Similarly, the comparator 130 receives the RDIFF signal 136 and an output from the right channel NDAC 128, and, by way of feedback provided by the logic 127 and the counter 125, causes the output of the NDAC 128 (i.e., the NDAC voltage) to track and hold the negative peaks of the RDIFF signal 136. Therefore, the differential voltage between the output of the PDAC 126 and the output of the NDAC 128 represents the peak-to-peak amplitude of the RDIFF signal 136.

The PDAC and NDAC voltages (RPPEAK and RNPEAK) are provided to the threshold generation module 132. The transmission gates 133a, 133d provide the threshold voltage 134 as one of two voltage values as described above, depending upon the control voltages RPeakOutP and its inverse RPeakOutN applied to the transmission gates 133a, 133d respectively. Similarly, the transmission gates 133b, 133c provide the threshold 135 voltage as one of two voltage values as described above, depending upon the control voltages RThreshOutP and its inverse RThreshOutN applied to the transmission gates 133b, 133c respectively.

It should be recognized from the discussion above that the two states of the threshold voltage 134 are closely associated with the positive peak and the negative peak of the RDIFF signal 136, while the two states of the threshold 135 are closely associated with a midpoint of the RDIFF signal 136. This difference is accomplished by way of the control signals applied to the transmission gates 133a, 133d compared to control signals applied to the transmission gates 133b, 133e. The control signals are further described below in conjunction with FIGS. 2A and 2B.

A shared AGC DAC 152 is shown in the lower half of FIG. 2, providing a shared AGC DAC output signal 154 to control the gain of both the RAGC 114 and LAGC 156 amplifiers. The shared AGC DAC output signal 154 causes both the right and the left channels to have substantially the same gain. One of ordinary skill in the art will understand how to set the shared AGC DAC 152 to provide and appropriate shared AGC DAC output signal 154.

Unlike the arrangements described in U.S. Pat. No. 7,772,838, the rotation detector 101 includes the threshold generation module 132 (and 174), which generates the above-described four thresholds, a right channel threshold detector upper threshold, RThreshUpA, a right channel threshold detector lower threshold, RThreshLowA, a right channel peak detector upper threshold, RThreshUpB, and a right channel peak detector lower threshold, RThreshLowB.

As described above, the right channel threshold detector upper threshold, RThreshUpA, and the right channel threshold detector lower threshold, RThreshLowA, are alternately received at a first input of comparator 138. A magnetic field signal, 136, RDIFF, is received at a second input of the comparator 138. The comparator 138 forms a part of a threshold detector.

The right channel peak detector upper threshold, RThreshUpB and the right channel peak detector lower threshold, RThreshLowB, are alternately received at a first input of comparator 116. The magnetic field signal 136, RDIFF, is received at a second input of the comparator 116. The comparator 116 forms a part of a peak detector.

Generation of the thresholds is described more fully below in conjunction with FIGS. 3-7.

Also unlike the arrangements described in U.S. Pat. No. 7,772,838, in some optional embodiments, the right and left channels can include respective noise measurement modules 190, 192, each configured to measure a noise, for example a noise of a respective DIFF signal, e.g., the RDIFF signal 136 and the LDIFF signal 158. Each noise measurement module can be configured to generate a respective noise amplitude value 190a, 192a representative of the measured noise and provide the noise amplitude value 190a, 102a to a respective one of the threshold generation modules 132, 174. In some embodiments, the noise value is representative of a statistical parameter of the measured noise, for example, one standard deviation, two standard deviations, or three standard deviations of the measured noise.

In some embodiments, the noise measurement modules 190, 192 can filter respective input signals to select a band of interest, for example, a band selected to be outside of a band of magnetic field frequencies to which the magnetic field sensing elements 14a-14c are responsive. The noise measurement modules 190, 192 can identify an RMS value of the noise in the band of interest. The noise measurement modules can adjust the measured RMS value of the noise in the hand of interest to estimate an RMS noise in the band of magnetic field frequencies to which the magnetic field sensing elements 14a-14c are responsive. The noise measurement modules can calculate the above-described statistical parameter of the noise.

While right and left channel automatic gain controls 114, 156 are shown, in other embodiments, the right and left channels 101, 103 have fixed gains. However, it should also be understood that, even for embodiments that use automatic gain controls, the automatic gain controls have a largest gain that is achieved for small magnetic field signals, i.e., for small magnetic field signals 104, 142. For magnetic field signals smaller than those which cause the automatic gain control to achieve maximum gain, the DIFF signals, RDIFF 136 and LDIFF 158, with which the rotation detectors 100 of FIG. 2 can compare thresholds at the various comparators can have amplitudes smaller than those which the automatic gain control can increase. Also, at the maximum gain of the automatic gain controls 114, 156, typically, system electrical noise has reached a maximum.

The amplitude of the RDIFF and LDIFF signals 136, 158 can change due to a variety of factors. Notably, the amplitude of the RDIFF and LDIFF signals 136, 158 is directly influenced by an air gap between the magnetic field sensor 10 (FIG. 1) and a ferromagnetic object (11, FIG. 1) sensed by the magnetic field sensor 10. The air gap can vary, for example, due to installation difference, due to temperature, or due to mechanical wear. In some magnetic field sensors, the automatic gain control 114, 156 is set to a maximum gain for a desired air gap, and the automatic gain control can only cause less gain. Thus, smaller RDIFF and LDIFF signals 136, 158 result from larger than desired air gaps.

While it is implied in FIG. 2 and in other figures below that many of the circuit elements are analog circuit elements and analog modules, in other embodiments, any one or more of the circuit elements of FIG. 2 and figures below can be comprised of digital circuits and digital modules. Accordingly, some digital-to-analog conversions or analog-to-digital conversions are not shown, but it will be apparent where such conversion would be added depending upon whether analog or digital circuit elements and modules are used.

While particular circuits to identify RPPEAK, RNPEAK, LPPEAK, AND LNPEAK signals are shown, other circuits can be used for this purpose. For example, some other techniques are described in U.S. Pat. No. 7,199,579, issued Apr. 3, 2007 and assigned to the assignee of the present application.

Figure 3:
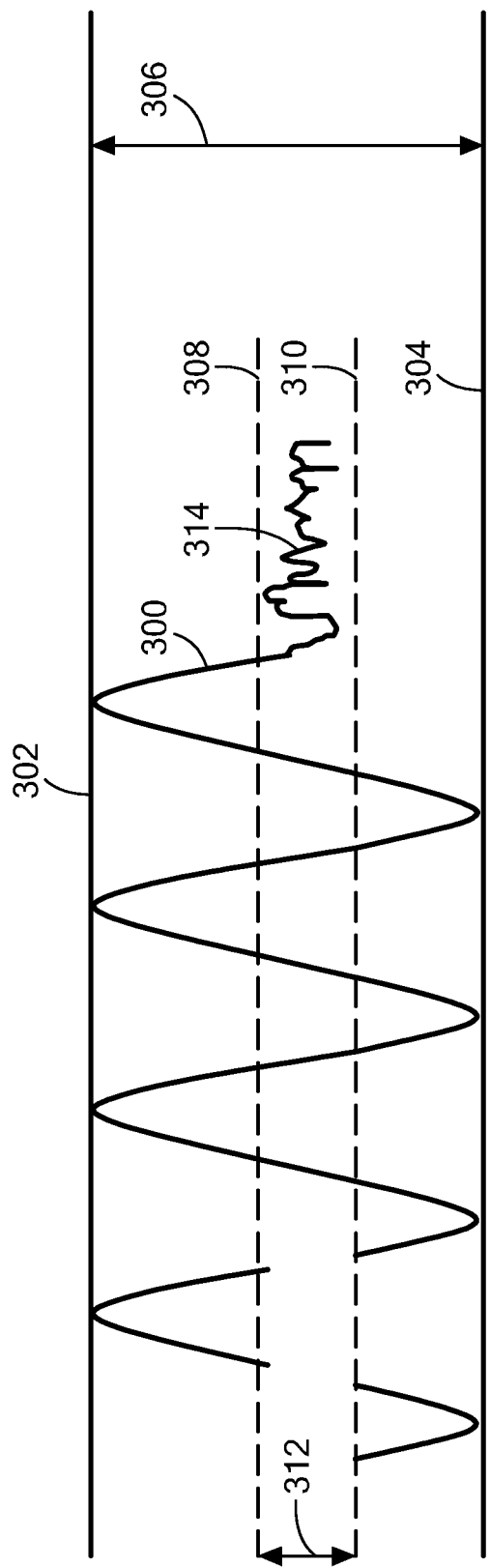
FIG. 3 is a graph showing a magnetic field signal and thresholds.

Referring now to FIG. 3, a magnetic field signal 300 is representative, for example, of the RDIFF signal 136 of FIG. 2. The magnetic field signal 300 can have positive peaks representative of gear teeth passing by the magnetic field sensing elements 14a, 14b of FIG. 1 and valleys representative of gear valleys passing by the magnetic field sensing elements 14a, 14b.

A value 302 is representative of a value of the positive peaks, and a value 304 is representative of a value of the negative peaks. It should be understood that the value 302 is representative of the RPPEAK signal of FIG. 2 and the value 304 is representative of the RNPEAK signal, both received by the threshold generation module 132. A range 306 is representative of a peak-to-peak value of the magnetic field signal 300.

A threshold value 308 is representative of a right channel threshold detector upper threshold, RThreshUpA, of FIG. 2. A threshold value 310 is representative of the right channel threshold detector lower threshold, RThreshLowA, of FIG. 2. A range 312 is representative of a difference between the upper threshold 308 and the lower threshold 310.

A system noise 314 is shown to be inside of the thresholds. The noise 314, being within the thresholds 308, 310 will not cause false triggering of the comparator 138 of FIG. 2. However, if the noise were larger in amplitude or the thresholds 308, 310 were closer together, the noise 314 would cause false triggering.

Figure 4:
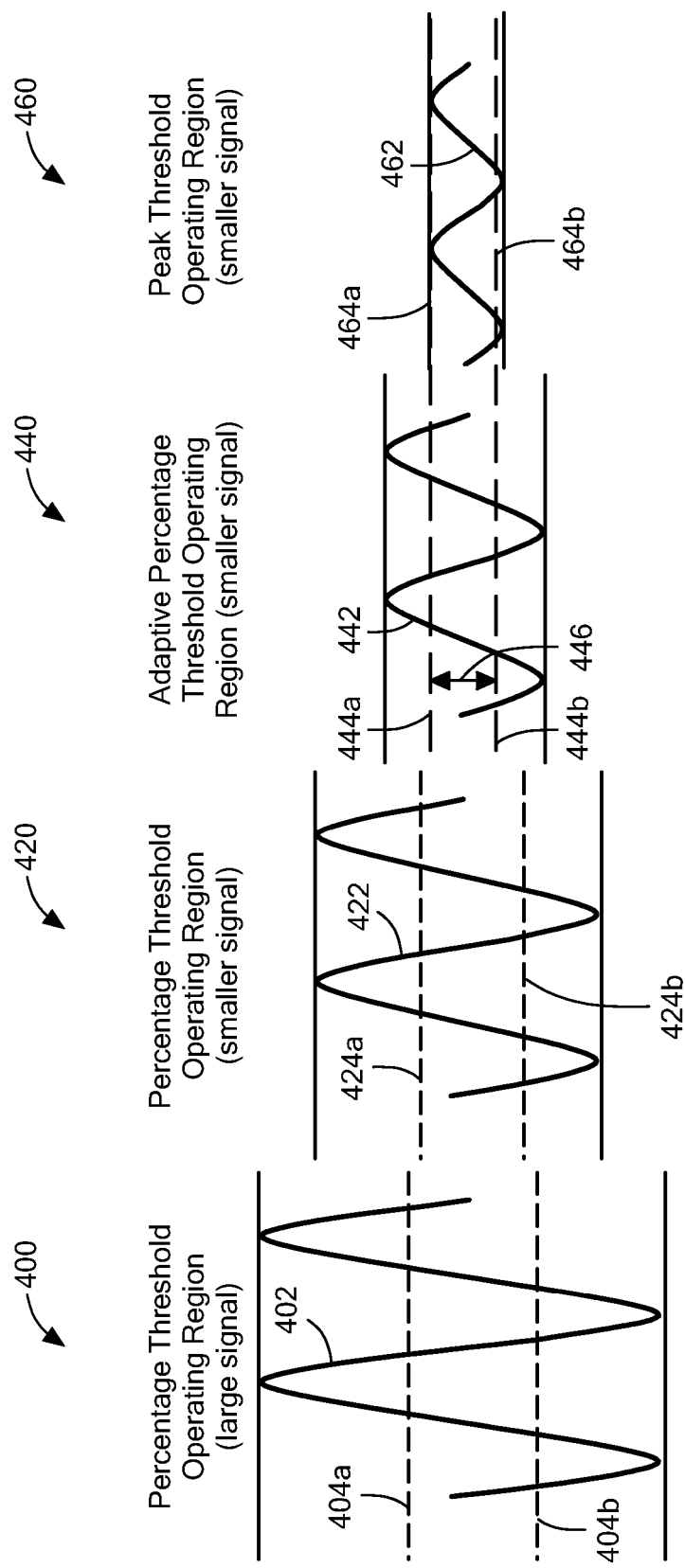
FIG. 4 is a graph showing further magnetic field signals and further thresholds.

Referring now to FIG. 4, four graphs 400, 420, 440, 460 show four sinusoids 402, 422, 442, 462, respectively, each sinusoid representative of a different magnitude of a magnetic field signal, for example, the RDIFF signal 136 of FIG. 2.

In the graph 400, a largest RDIFF signal 402 is shown along with upper and lower thresholds 404a, 404b, respectively, that are at predetermined percentages, for example, forty percent and sixty percent, of a peak-to-peak value of the RDIFF signal 402. These thresholds 404a, 404b are used in a "percentage threshold operating region."

In the graph 420, the RDIFF 422 signal is smaller, but still, upper and lower thresholds 424a, 424b are at the same predetermined percentages, for example, forty percent and sixty percent, of the peak-to-peak value of the RDIFF signal 422. These thresholds 424a, 424b are used in the "percentage threshold operating region."

In the graph 440, the RDIFF signal 442 is still smaller, and upper and lower threshold values 444a, 444b are not at the same predetermined percentages. Instead, they remain at values in accordance with a minimum separation (arrow 446) between the upper threshold value 444a and the lower threshold value 444b. In essence, as the RDIFF signal 442 becomes still smaller, the upper and lower threshold values 444a, 444b stay in the same place having the same minimum separation indicated by the arrow 446, and thus, the upper threshold value 444a becomes a larger percentage of the peak-to-peak value of the RDIFF signal 442 and the lower threshold value 444b becomes a lower percentage. These thresholds are used in an "adaptive percentage threshold operating region."

In the graph 460, upper and lower threshold values 462a, 462b are substantially the same as the threshold values 444a, 444b of the graph 440, but an RDIFF signal 462 has taken on an amplitude that is a smallest RDIFF signal 462 that will still cross the upper and lower threshold values 464a, 464b. These thresholds are used in a "peak threshold operating region," and are the same as the thresholds used in the "adaptive percentage threshold operating region" of the graph 440.

In some embodiments, the minimum allowed separation (e.g., arrow 446) of the upper and lower threshold values can be a predetermined minimum separation, or, more precisely, a separation according to a minimum equivalent voltage difference. In some optional embodiments, the minimum allowed separation (e.g., arrow 446) can be determined by the magnetic field sensor in accordance with a noise amplitude value, for example, for example, the noise amplitude value 190a generated by the noise measurement module 190 of FIG. 2. In some embodiments, the minimum separation (e.g., arrow 446) can be determined in accordance with a predetermined standard deviation of the noise amplitude, for example, two standard deviations of the noise amplitude of the measured noise. Other factors or standard deviations can also be used.

Figure 5:
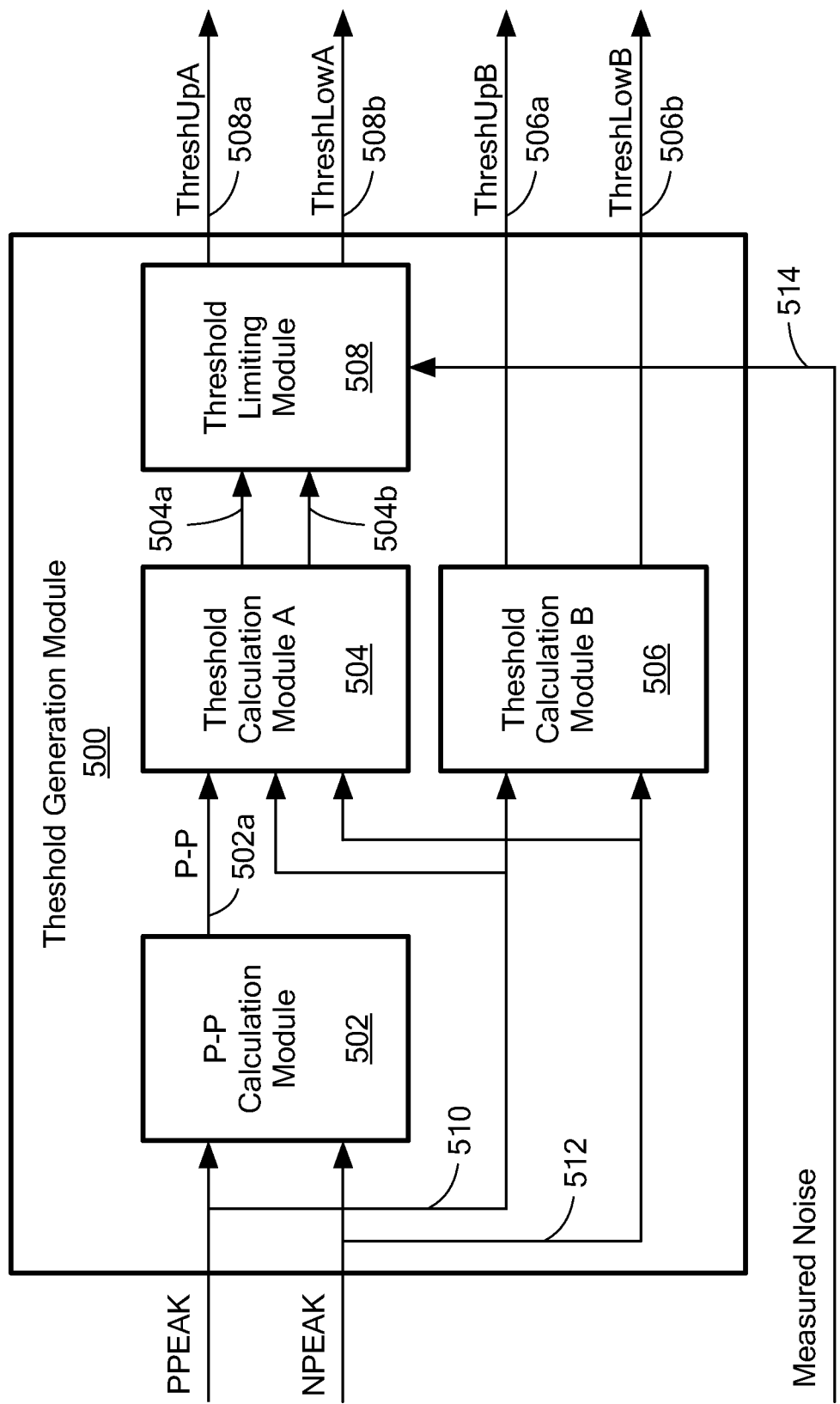
FIG. 5 is a block diagram showing an example of a threshold generation module that may be used in the rotation detectors of FIG. 2.

Referring now to FIG. 5, an example of a threshold generation module 500 can be the same as or similar to each one of the threshold generation modules 132, 174 of FIG. 2. As described above, some digital-to-analog conversions or analog-to-digital conversions are not shown, but it will be apparent where such conversion would be added depending upon whether analog or digital circuit elements and modules are used.

The threshold generation module 500 can include a peak-peak (P-P) calculation module 502 coupled to receive the PPEAK signal and the NPEAK signal of FIG. 2. The P-P calculation module can calculate a PP value 502a representative of a peak-to-peak amplitude of a DIFF signal, for example, the RDIFF signal 136 or the LDIFF signal 158 of FIG. 2.

A first threshold calculation module 504 is coupled to receive the PP value 502a and coupled to receive a PPEAK value 510, and an NPEAK value 512, which can be the same as or similar to the RPPEAK and RNPEAK values or the LPPEAK and LNPEAK values of FIG. 2, which can be representative of positive peak values and negative peak values of the RDIFF or LDIFF signals 136, 158 of FIG. 2.

The first threshold calculation module 504 is configured to generate two calculated threshold values 504a, 504b as predetermined percentages between the PPEAK value 510 and the NPEAK value 512. For example, in some embodiments the two predetermined percentages are about sixty percent and about forty percent. However, other percentages can be used.

A threshold limiting module 508 is coupled to receive the two calculated threshold values 504a, 504b and configured either pass those two calculated threshold values 504a, 504b through to the output of the threshold generation module as threshold values ThreshUpA 508a and ThreshLowA 508b, or to limit the two threshold values, ThreshUpA 508a and ThreshLowA 508b, at the output of the threshold limiting module 508. Limiting of the two threshold values, ThreshUpA 508a and ThreshLowA 508b, is described more fully below in conjunction with FIG. 7. However, let it suffice here to say that the two threshold values, ThreshUpA 508*a* and ThreshLowA 508*b* can be limited so that a difference between the two threshold values 504*a*, 504*b* cannot go below a predetermined threshold value difference, or, more precisely cannot have a separation below a predetermined equivalent voltage.

A second threshold calculation module 506 is coupled to receive the PPEAK signal 510 and the NPEAK signal 512.

The second threshold calculation module 506 is configured to generate two threshold values 506*a*, 506*b* predetermined distances from the PPEAK and NPEAK values 510, 512, respectively. It will be appreciated that the second threshold calculation module 506 can be part of a peak detector for which thresholds are close to peaks of an RDIFF or an LDIFF signal (e.g., 136, 158 of FIG. 2).

In alternate embodiments, the second threshold calculation module 506 can instead result in a second threshold detector and is configured to generate the two threshold values 506*a*, 506*b* as predetermined percentages between the PPEAK value 510, and the NPEAK value 512. For example, in some embodiments the two predetermined percentages are about ninety percent and about ten percent. However, other percentages can be used. It will be appreciated that the second threshold calculation module 506 can generate thresholds values that are closer to peaks of the RDIFF or the LDIFF signal (e.g., 136, 158 of FIG. 2).

Figure 6:
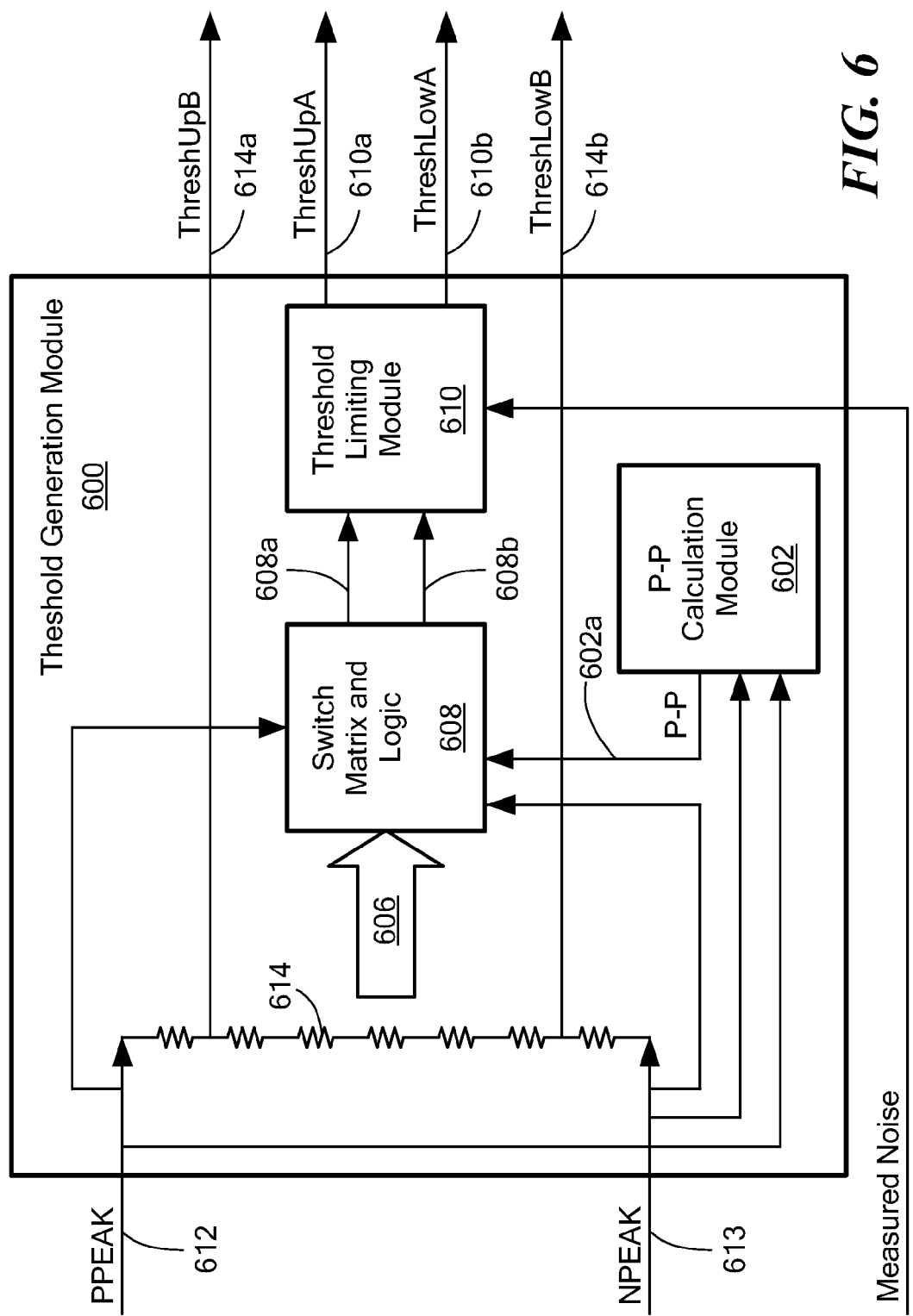
FIG. 6 is a block diagram showing an example of another threshold generation module that may be used in the rotation detectors of FIG. 2.

Referring now to FIG. 6, another example of a threshold generation module 600 can be the same as or similar to each one of the threshold generation modules 132, 174 of FIG. 2. As described above, some digital-to-analog conversions or analog-to-digital conversions are not shown, but it will be apparent where such conversion would be added depending upon whether analog or digital circuit elements and modules are used.

A peak-to-peak (P-P) calculation module 602 can be the same as or similar to the peak-to-peak calculation module 502 described above in conjunction with FIG. 5. The P-P calculation module 602 is configured to generate a peak-to-peak (P-P) value 602*a* that can be the same as or similar to the above-described P-P value 502*a*.

A resistor ladder 614 is coupled to receive a PPEAK value 612 at a first end and to receive an NPEAK value 613 at another end, which can be the same as or similar to the RPPEAK and RNPEAK values or the LPPEAK and LNPEAK values of FIG. 2, which can be representative of positive peak values and negative peak values of the RDIFF or LDIFF signals 136, 158 of FIG. 2.

A switch matrix and logic module 608 can be coupled to receive the PPEAK value 612 and the NPEAK value 613, coupled to receive a plurality of signal values 606 from taps of the resistor divider 614, and coupled to receive the P-P value 602*a*.

The switch matrix and logic module 608 is configured to generate two calculated threshold values 608*a*, 608*b* as predetermined percentages between the PPEAK value 612 and the NPEAK value 613. For example, in some embodiments the two predetermined percentages are about sixty percent and about forty percent. Selection of taps of the resistor divider 614, i.e., selection from among the signal values 606, can be used to this end. However, other percentages can be used.

A threshold limiting module 610 is the same as or similar to the threshold limiting module 508 described above in conjunction with FIG. 5.

Other threshold values 614*a*, 614*b* comparable to ThreshUpB 506*a* and ThreshLowB 506*b* of FIG. 5 can be generated from taps directly off of the resistor divider 614, which, for example, generates threshold voltages at ninety percent and ten percent of the peak-to-peak voltage of the DIFF signal, for example, the RDIFF or LDIFF signals 136, 158 of FIG. 2.

Figure 7:
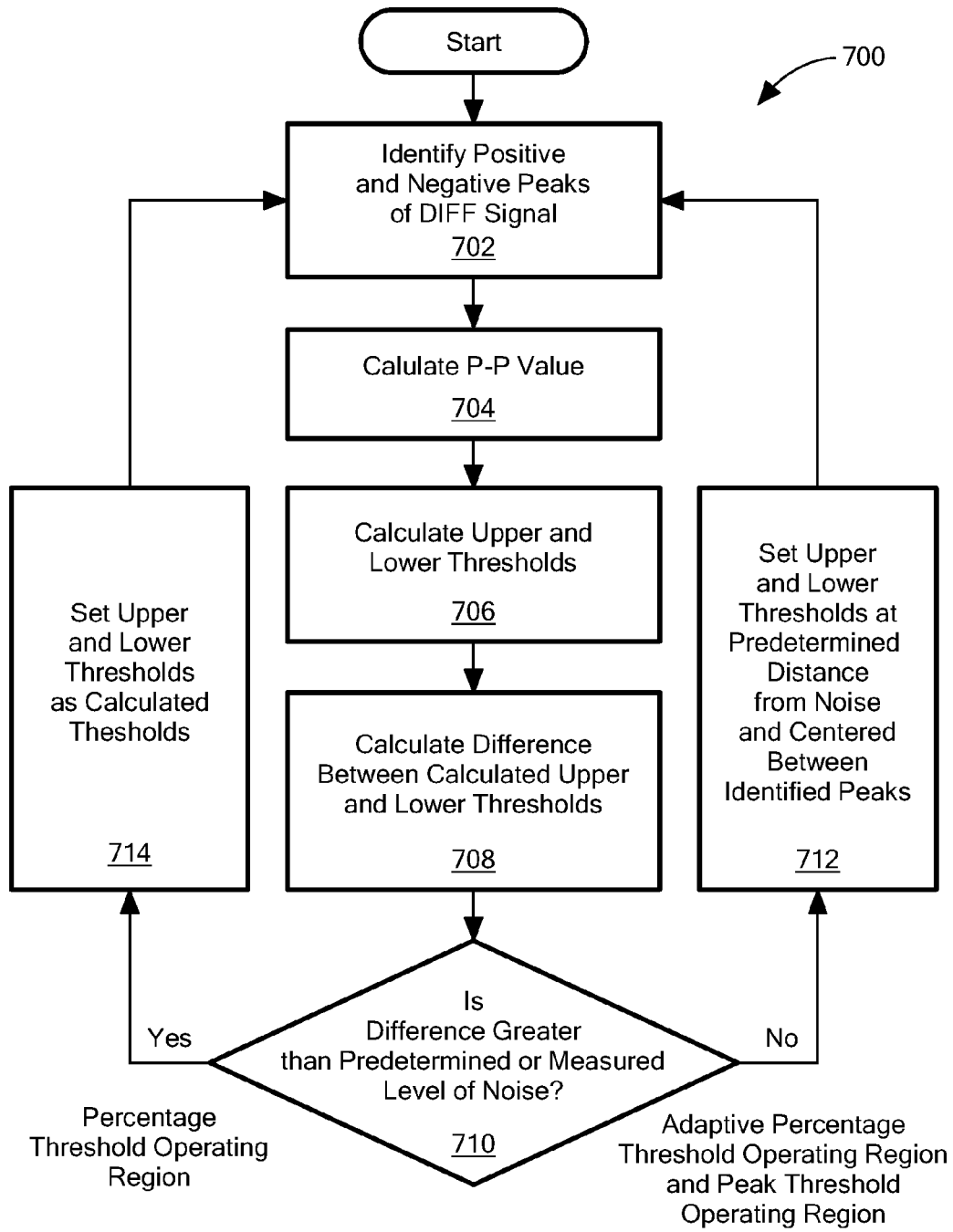
FIG. 7 is a flow chart showing a process that can be used in the threshold generation modules of FIGS. 5 and 6.
Figure 13:
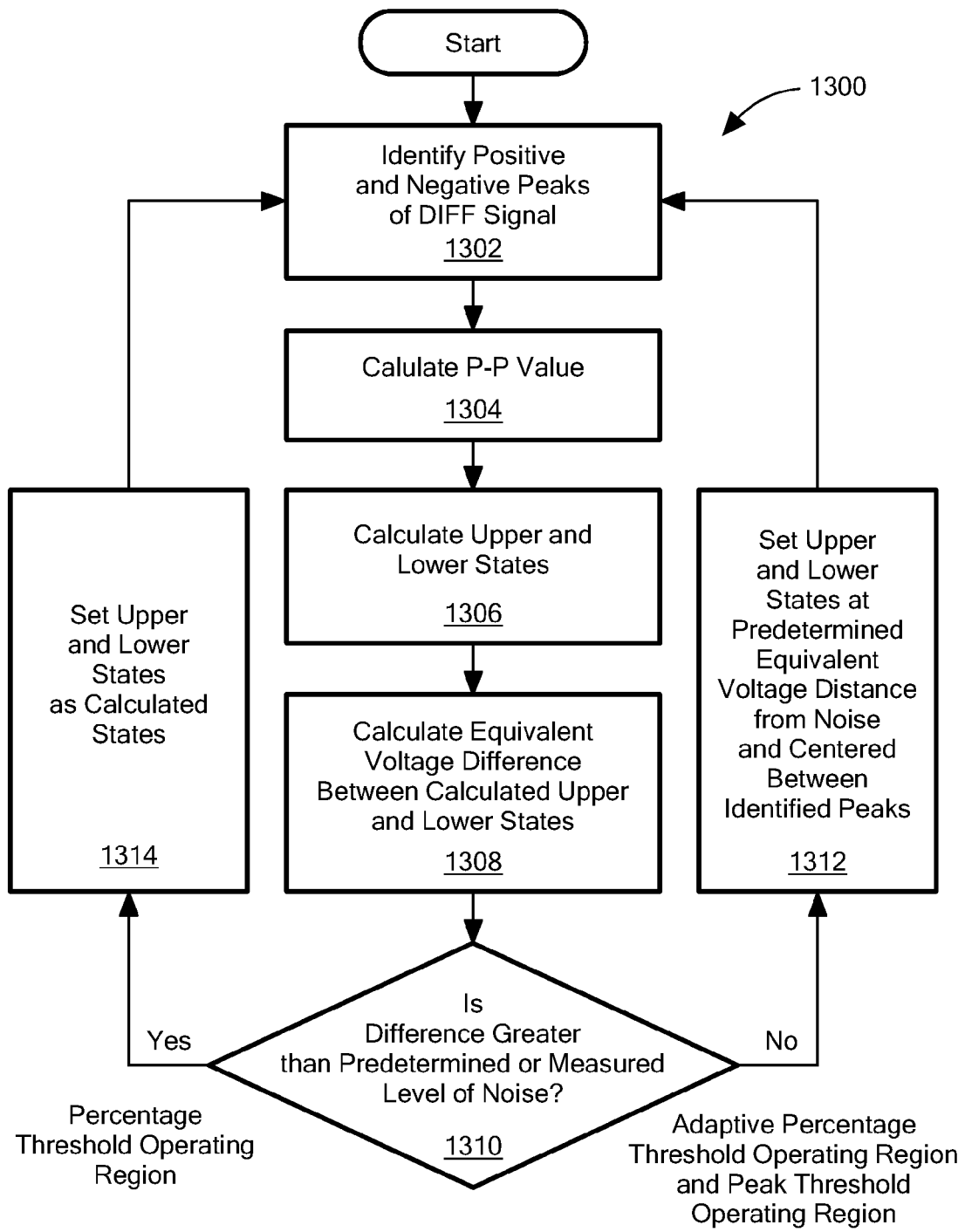
FIG. 13 is a flow chart showing a process that may be used by the threshold or state generation module of FIG. 14.

It should be appreciated that FIGS. 7 and 13 show flowcharts corresponding to the below contemplated technique which would be implemented in magnetic field sensors of FIGS. 1 and 8. Rectangular elements herein denoted "processing blocks," represent computer software instructions or groups of instructions. Diamond shaped elements, herein denoted "decision blocks," represent computer software instructions, or groups of instructions, which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Referring now to FIG. 7, a process 700 can be used by the threshold generation modules of FIG. 2, and by the first threshold generation modules 500, 600 of FIGS. 5 and 6, respectively.

At block 702, positive and negative peaks of a DIFF signal to identified and corresponding peak values are generated. The values correspond to the above-described PPEAK and NPEAK values of FIGS. 2, 5, and 6.

At block 704, a peak-to-peak amplitude of the DIFF signal is calculated, for example by the P-P calculation modules 502, 602 of FIGS. 5 and 6, respectively.

At block 706, using the PPEAK value, the NPEAK value, and the calculated P-P value, upper and lower thresholds are calculated, for example, by the threshold generation modules 132, 174 of FIG. 2, by the threshold calculation module 504 of FIG. 5, or by the switch matrix and logic module 608 of FIG. 6. The calculated threshold values are represented as threshold values 308, 310 of FIG. 3 and threshold values 404*a*, 404*b*, 424*a*, 424*b* of FIG. 4. In some embodiments, the two threshold values are at about sixty percent and about forty percent of the peak-to-peak value and symmetrical about a center value between the PPEAK and NPEAK values.

At block 708, a difference is calculated, for example, by the threshold limiting modules of FIGS. 5 and 6, between the above-described calculated threshold values calculated at block 706.

At block 710, it is determined if the above difference between the above-described calculated threshold values is greater than a level of system noise. In some embodiments, the level of system noise is a predetermined level of system noise. In other embodiments the level of system noise is a measured and calculated level of system noise described above in conjunction with the noise measurement modules 190, 192 of FIG. 2.

If the difference between the above-described calculated threshold values is greater than a level of the system noise (predetermined or calculated), then the two threshold values are far enough apart such that system noise is unlikely to cause false triggering of comparators that use the thresholds.

If the difference is great enough then, at block 714, the upper and lower thresholds, for example, ThreshUpA 133b and ThreshLowA 133c of FIG. 2 are set to be equal to the calculated upper and lower threshold values calculated at block 706. These thresholds are used in the percentage threshold operating regions in the left to panels of FIG. 4.

If the difference between the above-described calculated threshold values is not greater than the level of the system noise (predetermined or calculated), then, at block 712, the upper and lower thresholds, namely, ThreshUpA and ThreshLowA, are set to be equal to a predetermined level or predetermined distance from the noise level and centered between the positive and negative peaks, i.e., the PPEAK value and the NPEAK values, of the DIFF signal. These thresholds are used in the adaptive percentage threshold operating region and in the peak threshold operating region described in graphs 440, 460 FIG. 4, respectively.

In other embodiments, in the adaptive percentage threshold operating region and in the peak threshold operating region, the upper and lower thresholds are not centered between positive and negative peaks. For example, one of the thresholds can be held at a value determined in the percentage threshold operating region and the other threshold can be set a predetermined distance away therefrom.

Figure 8:
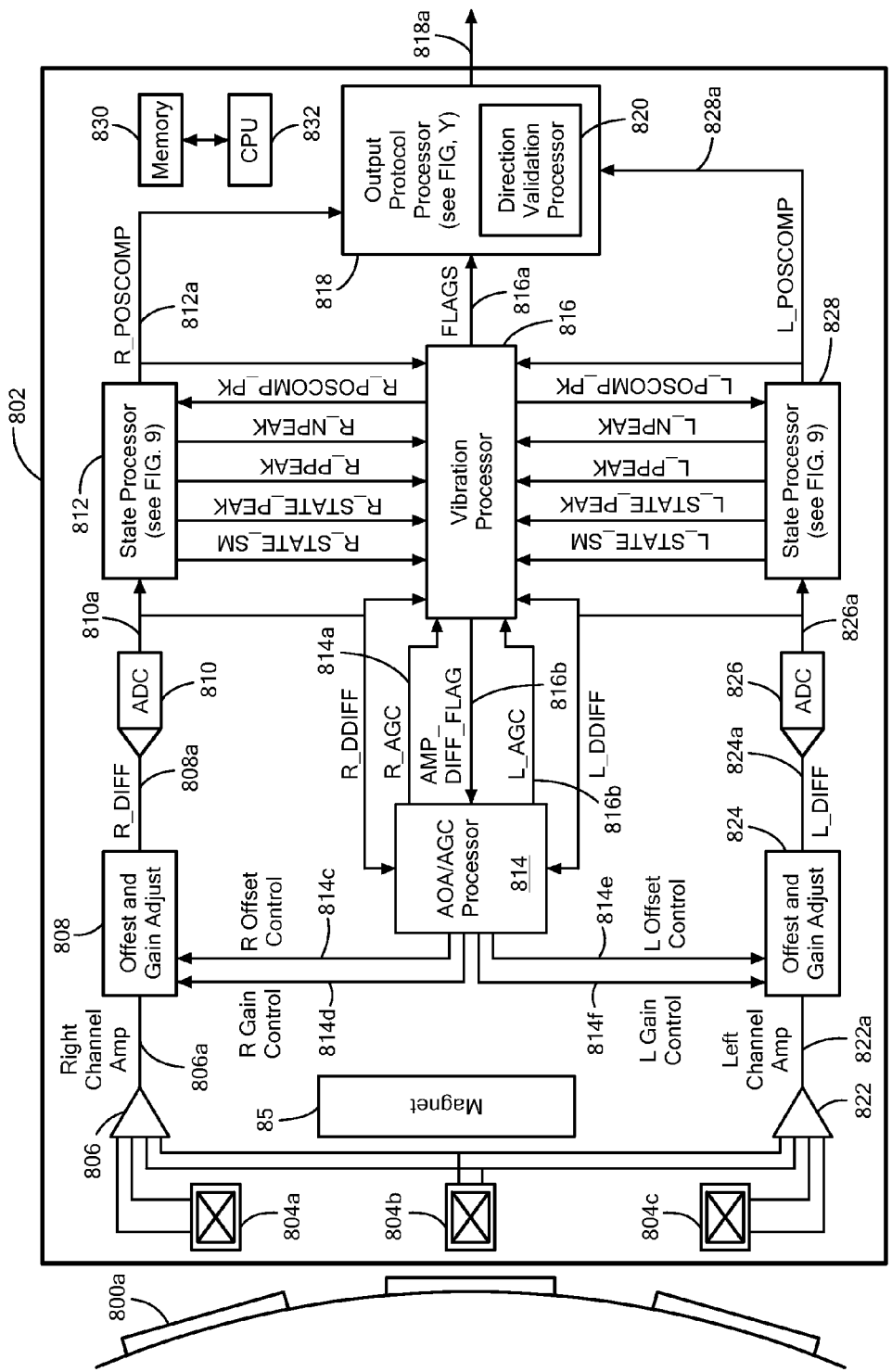
FIG. 8 is a block diagram showing an example of another magnetic field sensor having state processors.

Referring now to FIG. 8, a magnetic field sensor 802 is similar to and substantially described in conjunction with FIG. 1 of U.S. Pat. No. 8,450,996, issued May 28, 2013. The magnetic field sensor 802 is different in electronic structure from the magnetic field sensor 10 of FIG. 1.

The magnetic field sensor 802 includes three magnetic field sensing elements 804a-804c, each configured to generate a respective magnetic-field-sensing-element signal in response to passing teeth of a rotating gear 800, of which a tooth 800a is but one example. The motion sensor 802 also includes a right channel amplifier 806 and a left channel amplifier 822. The terms "right" and "left" are arbitrary identifiers, which indicate different physical positions of the magnetic field sensing elements that contribute to a right channel and a left channel.

The motion sensor 802 can include offset and gain adjustment circuits 808, 824 that remove unwanted DC offsets and provide adjustable gains to signals 806a, 822a provided by the amplifiers 806, 822, respectively. The offset and gain adjustment circuits 808, 824 generate an R_DIFF signal 808a and an L_DIFF signal 824a, respectively. In some alternate embodiments, the motion sensor 802 includes only offset or only gain adjustment circuits.

The offset and gain adjustment circuits 808, 824 are not described in detail herein. However, the offset and gain adjustment circuits 808, 824 can be of a type described in U.S. Pat. No. 7,138,793, issued Nov. 21, 2006, which is assigned to the assignee of the present invention.

The R_DIFF signal 808a and the signal 824a are referred to herein as magnetic field signals, which are responsive to magnetic fields sensed by the magnetic field sensing elements 804a-804c. The R_DIFF signal 808a is representative of a magnetic field experienced by the magnetic field sensing elements 804a, 804b and the L_DIFF signal 824a is representative of a magnetic field experienced by the magnetic field sensing elements 804b, 804c.

The motion sensor 802 can include an analog-to-digital converter (ADC) 810 coupled to receive the R_DIFF signal 808a and configured to generate a right channel digital DIFF signal, R_DDIFF, 810a. Another analog-to-digital converter (ADC) 826 is coupled to receive the L_DIFF signal 824a and configured to generate a left channel digital DIFF signal, L_DDIFF, 826a. The R_DDIFF signal 810a and the L_DDIFF signal 826a are also referred to herein as magnetic field signals.

The motion sensor 802 can include a first state processor 812 coupled to receive the R_DDIFF signal 810a and configured to generate a plurality of signals including a right channel state signal, R_STATE_SM, indicative of a plurality of states associated with the R_DDIFF signal 810a, where each state is indicative of a range of signal values into which the R_DDIFF signal 810a falls during a respective time period.

The first state processor 812 is also configured to generate an R_POSCOMP signal 812a, which, from discussion below, will be understood to be a two state signal having state transitions according to predetermined states of the R_STATE_SM signal.

Similarly, the motion sensor 802 can include a second state processor 828 coupled to receive the L_DDIFF signal 826a and configured to generate a plurality of signals including a left channel state signal, L_STATE_SM, indicative of a plurality of states associated with the L_DDIFF signal 826a, where each state is indicative of a range of signal values into which the L_DDIFF signal 826a falls during a respective time period.

The second state processor 828 is also configured to generate an L_POSCOMP signal 828a, which, from discussion below, will also be understood to be a two state signal having state transitions according to predetermined states of the L_STATE_SM signal.

Signal states are described more fully in conjunction with FIGS. 10 and 11 below.

The state processors 812, 828 are also configured to generate an R_STATE_PEAK signal and an L_STATE_PEAK signal, respectively, which are further described below in conjunction with FIGS. 10 and 11, and which are signals similar to the R_STATE_SM and L_STATE_SM signals, but with a reduced amount of undesirable chatter between states.

The state processors 812, 828 are also configured to generate an R_PPEAK signal and an L_PPEAK signal, respectively, which is further described below in conjunction with FIG. 10, and which are signals indicative of magnitudes of positive peaks of the R_DIFF signal and the L_DDIFF signal, respectively.

The state processors 812, 828 are also configured to generate an R_NPEAK signal and an L_NPEAK signal, respectively, which is further described below in conjunction with FIG. 10, and which are signals indicative of magnitudes of negative peaks of the R_DDIFF signal and the L_DDIFF signal, respectively.

The state processors 812, 828 are also configured to generate an R_POSCOMP_PK signal and an L_POSCOMP_PK signal, respectively, which are further described below in conjunction with FIGS. 10 and 11, and which are signals similar to the R_POSCOMP and L_POSCOMP signals 812a, 828a, but with different timing.

The motion sensor 802 can include a vibration processor 816 coupled to receive the R_POSCOMP signal 812a, the L_POSCOMP signal 828a, the R_STATE_SM signal, the L_STATE_SM signal, the R_STATE_PEAK signal, the L_STATE_PEAK signal, the R_PPEAK signal, the L_PPEAK signal, the R_NPEAK signal, the L_NPEAK signal, the R_POSCOMP_PK signal, and the L_POSCOMP_PK signal.

The vibration processor 816 is also coupled to receive an R_AGC signal 814a and a L_AGC signal 814b, representative of values of right and left channel automatic gain control signals 814d, 814f, respectively. The vibration processor 816 is configured to generate one or more FLAG signals (binary indicators) 816a and an amplitude difference flag signal (AMP_DIFF_FLAG signal) 816b, each of which can be indicative of a vibration of the object 800, or of no vibration of the object 800.

In some embodiments, the vibration processor 816 can include two or more vibration sub-processors, each of which can detect a vibration and each of which can contribute to the FLAG signals 816a, 816b. For example, each one can contribute one or more vibration bits, each indicative of a vibration. The vibration processor 816 is not further described herein but is a subject of U.S. Pat. No. 8,450,996, issued May 28, 2013.

The magnetic field sensor 802 can also include an automatic offset adjusting (AOA) processor 814 together with an automatic gain control (AGC) processor 814, herein referred to together as an AOA/AGC processor 814. The AOA/AGC processor 814 is coupled to receive the R_DDIFF signal 810a, the L_DDIFF signal 826a, and the amplitude difference flag signal, AMP_DIFF_FLAG, 816b. The AOA/AGC processor 814 is configured to generate right and left channel gain control signals 814d, 814f, respectively, and also right and left channel offset control signals 814c, 814e, respectively, to control gain and offset of the offset and gain adjust modules 808, 824. The AOA/AGC processor 814 is also configured to generate signals R_AGC and L_AGC 814a, 814b, respectively, which are signals representative of the gain control signals 814d, 814f, respectively. In some alternate embodiments, the AOA/AGC processor 814 is instead only an AOA processor or an AGC processor.

The motion sensor 802 can include an output protocol processor 818 coupled to receive the R_POSCOMP signal 812a, the L_POSCOMP signal 828a, and the FLAG signals 816a. The output protocol processor 818 is configured to generate a motion signal 818a indicative of a motion (rotation) of the gear 800 and also indicative of the vibration of one or more of the magnetic field sensing elements 804a-804c and/or of the gear 802.

The output protocol processor 818 can include a direction validation processor 820 configured to process the R_POSCOMP signal 812a, the L_POSCOMP signal 828a, and the FLAG signal 816a to generate the motion signal 818a.

In some embodiments, the motion signal 818a is a single bit digital binary signal having a frequency related to the speed of rotation of the gear 800, and a selected one of two pulse widths indicative of a direction of rotation of the gear 800. In some embodiments, the motion signal 818a is blanked (i.e., is inactive) when the FLAG signal 816a is indicative of a vibration of the object 800. In some embodiments, upon a first power up of the motion sensor 802, the motions signal 818a is blanked (or otherwise does not indicate a direction of rotations) up until a valid time, after which it becomes active. Identification of the valid time is not further described herein, but is a subject of U.S. Pat. No. 8,450,996, issued May 28, 2013. In other embodiments, the motion signal 818a can indicate aspects of the rotation of the gear 800 in other ways, and the above-described vibration can be represented in other ways.

Exemplary output signals with different protocols are described in U.S. Pat. No. 8,624,588, issued Jan. 7, 2014, in U.S. Pat. No. 6,815,944, issued Nov. 9, 2004, and in U.S. Pat. No. 7,026,808, issued Apr. 11, 2006.

In some embodiments, the motion sensor 802 is comprised of a custom electronic device having electronic components, for example, gates, configured to implement the various processors and modules described above and the various processes described below. In some other embodiments, the motion sensor 802 has a structure comprised of a central processing unit 832 and a memory 830 (a computer-readable storage medium), for example, a program memory, configured to implement the various processors and modules described above and the various processes described below.

A magnet 85 can provide back biasing of three magnetic field sensing elements 804a, 804b, 804c. The two state processors 882, 828 result in a different type of magnetic field sensor than the magnetic field sensor shown in FIG. 1 herein.

As described below in conjunction with FIG. 9, the state processors 882, 828 have characteristics that are not described in U.S. Pat. No. 8,450,996.

While right and left channel automatic gain controls 808, 824 are shown, in other embodiments, the right and left channels have fixed gains. However, it should also be understood that, even for embodiments that use automatic gain controls, the automatic gain controls have a maximum gain that is achieved for small magnetic field signals, i.e., for small magnetic field signals 806a, 822a. For magnetic field signals smaller than those which cause the automatic gain controls to achieve maximum gain, the DIFF signals, R_DIFF 808a and L_DIFF 824a, with which the rotation detectors 100 of FIG. 2 can compare thresholds at the various comparators 116, 138, 160, 180 can have amplitudes smaller than those which the automatic gain control can increase. Also, at the maximum gain of the automatic gain controls, system electrical noise has reached a maximum.

Figure 9:
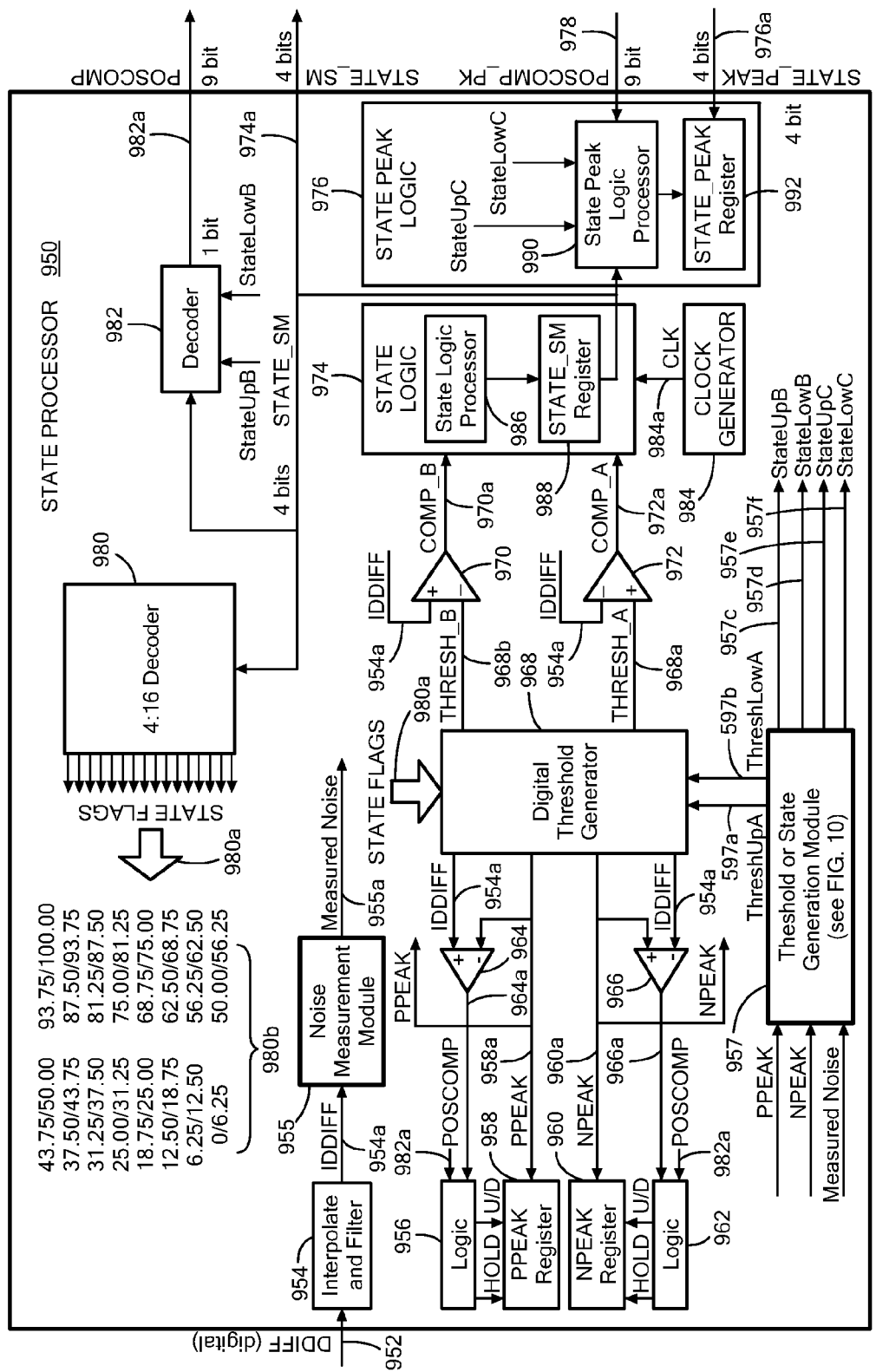
FIG. 9 is a block diagram of a state processor that may be used in the magnetic field sensor of FIG. 8, the state processor having a threshold or state generation module.

Referring now to FIG. 9, a state processor 950 is the same as or similar to either one of the state processors 812, 828 of FIG. 8. The state processor 950 is similar to and substantially described in conjunction with FIG. 2 of U.S. Pat. No. 8,450,996.

The state processor 950 can be the same as or similar to each one of the state processors 812, 828 of FIG. 8, but is shown here for only one of the left or the right channels of FIG. 8. The state processor 950 is coupled to receive a DDIFF signal 952, which can be the same as or similar to the R_DDIFF signal 810a or the L_DDIFF signal 826a of FIG. 8. In FIG. 9, the right and left channel designations (R and L) are omitted since the state processor 950 can be the same in the right and left channels.

In some embodiments, the state processor 950 can include an interpolation and filtering module 954 coupled to receive the DDIFF signal 952 and configured to generate an interpolated digital DIFF signal (IDDIFF) 954a. The interpolation and filtering can be performed in a variety of ways to result in the IDDIFF signal 954a having a higher resolution and sampling rate than the DDIFF signal 952. In some embodiments, the DDIFF signal 952 has a sample rate of about three hundred thousand samples per second, and each sample is a nine-bit word. In some embodiments, the IDDIFF signal 954a has a sample rate of about 23 million samples per second (nine times the DDIFF rate), and each sample is a nine-bit word.

In some embodiments the interpolation and filter module 954 performs a six stage cascaded integrator comb (CIC) (a second order CIC) interpolating filter, with stages $1-z^{-9}$, $1-z^{-9}$, x9, $1/(1-z^{-1})$, $1/(1-z^{-1})$, and $1/81$, for a transfer function of:

$$[1-2z^{-9}+z^{-18}]/[81(1-2z^{-1}+z^{-2})]$$

Other types of interpolation and filter modules can also be used, for example, a linear interpolation filter, a quadratic interpolation filter, or an exponential interpolation filter.

The state processor 950 can include a PPEAK register 958 (which, in some embodiments, can be a counter), which can hold or count up or count down, under the control of a first logic circuit 956. The first logic circuit 956 is responsive to a POSCOMP signal 982a (which can be the same as or similar to the R_POSCOMP signal 812a or the L_POSCOMP signal 828a of FIG. 8) and to a comparator output signal 964a generated by a comparator 964. The PPEAK register 958 holds values that contribute to a PPEAK signal 958a that tracks positive peaks of the IDDIFF signal 954a.

Similarly, the state processor 950 includes an NPEAK register 960 (which, in some embodiments, can be a counter), which can hold or count up or count down, under the control of a second logic circuit 962. The second logic circuit 962 is responsive to the POSCOMP signal 982a and to a comparator output signal 966a generated by a comparator 966. The NPEAK register 960 holds values that contribute to an NPEAK signal 960a that tracks negative peaks of the IDDIFF signal 954a. Comparators 964, 966 can be digital comparators coupled to receive digital signals and configured to generate digital output signals.

Generation of the PPEAK signal 958a and the NPEAK signal 960a is further described below in conjunction with FIG. 10. However, let it suffice here to say that the PPEAK signal 958a and the NPEAK signal 960a are digital signals, wherein a difference between the PPEAK signal 958a and the NPEAK signal 960a is representative of a peak-to-peak amplitude of the IDDIFF signal 954a.

The state processor 950 can also include a digital threshold generator 968 coupled to receive the PPEAK signal 958a and the NPEAK signal 960a. Under control of a STATE FLAGS signal 980a, the digital threshold generator 968 is configured to generate selected threshold signals 968a, 968b that are at determined percentages of the peak-to-peak amplitude of the IDDIFF signal 954a. For example, for one time period, the threshold signals 968a, 968b can be near 39.25% and 37.50%, respectively, of the peak-to-peak amplitude of the IDDIFF signal 954a.

The two threshold signals 968a, 968b (also referred to a THRESH_A and THRESH_B) are received by comparators 972, 970, respectively, which are digital comparators. The comparators 970, 972 are also coupled to receive the IDDIFF signal 954a. The comparator 970 is configured to generate a COMP_B comparison signal 970a and the comparator 972 is configured to generate a COMP_A comparison signal 972a. It will be recognized that the comparators 970, 972 operate as a window comparator, and from the signals 970a, 972a, it can be deduced if the IDDIFF signal 954a is between the thresholds THRESH_A 968a and THRESH_B 968b.

The THRESH_A and THRESH_B signals 968a, 968b represent a pair of digital values selected to be one of sixteen pairs of values 980b. Therefore, at any instant in time, the comparators 970, 972 are able to identify in which of the sixteen ranges of values 980b the IDDIFF signal 954a resides. The ranges 980b are also referred to herein as states of the IDDIFF signal 954a (or states of the corresponding DIFF or DDIFF signals).

The state processor 950 can also include a state logic module 974 coupled to receive the COMP_A and COMP_B signals, 972a, 970a, respectively. Operation of the state logic module 974 is described more fully below in conjunction with FIGS. 10 and 11. However, let is suffice here to say that the state logic module 974 decodes the state information associated with the COMP_A and COMP_B signals 972a, 970a described above and provides a 4-bit STATE_SM signal 974a. The STATE_SM signal 974a is indicative of states, i.e., ranges, through which the IDDIFF signal 954a progresses.

The state logic module 974 can include a state logic processor 986 coupled to a STATE_SM register 988, which is configured to hold values (e.g., one value at a time, progressively) of the STATE_SM signal 974a.

The state processor 950 can also include a state peak logic module 976 coupled to receive the STATE_SM signal 974a and a POSCOMP_PK signal 978 described more fully below in conjunction with FIGS. 10 and 11. The state peak logic module 976 is configured to generate a STATE_PEAK signal 976a, which is similar to the STATE_SM signal 974a, but which has transitions with fewer transition errors (i.e., less chatter). The transition errors are described more fully below in conjunction with FIGS. 10 and 11.

The state peak logic module 976 can include a state peak logic processor 990 coupled to a STATE_PEAK register 992, which is configured to hold values of the STATE_PEAK signal 976a.

The state processor 950 can also include a 4:16 decoder 980 coupled to receive the STATE_SM signal 974a. The 4:16 decoder 980 is configured to provide one of sixteen control signals, i.e., STATE FLAGS 980a, as shown. Each one of the flags is indicative of a particular amplitude range from among a plurality of amplitude ranges 980b. The amplitude ranges 980b are expressed as percentages of a peak-to-peal range of the IDDIFF signal 954a.

While particular amplitude ranges 980b are shown, it will be understood that the amplitude ranges can be different than those shown, and need not be linearly configured.

The state processor 950 can also include a decoder 982 coupled to receive the STATE_SM signal 974a and configured to generate the POSCOMP signal 982a having transitions at times of particular ones of the state transitions within the STATE_SM signal 974a.

The state processor 950 can also include a clock generator circuit 984 that provides a clock signal, CLK, 984a to clock the state logic module and other processors and modules within the state processor 950.

The state processor 950 includes circuitry operable to generate the PPEAK signal 958a having values representative of amplitudes of positive peaks of a DIFF or of an MIFF signal and also operable to generate the NPEAK signal 960a having values representative of amplitudes of negative peaks of the DIFF or of the IDIFF signal.

Unlike U.S. Pat. No. 8,450,996, the state processor 950 can include a threshold or state generation module 957, which generates an upper threshold signal, ThreshUpA 957a, a lower threshold signal, ThreshLowA 957b, with or without the following: a first upper state signal, StateUpB 957c, a first lower state signal, StateLowB 957d, a second upper state signal, StateUpC 957e, and a second lower state signal, StateLowC 957f.

The two threshold signals 957a, 957b can be used by the digital threshold generator 968. The two first state signals 957c, 957d can be used by the decoder 982. The two second state signals 957e, 957f can be used by the state peak logic processor (couplings not shown).

Operation of the threshold signals 957a, 957b is described more fully below in conjunction with FIGS. 10-13. Operation of the state signals is also described more fully below in conjunction with FIGS. 10-13.

Also not described in U.S. Pat. No. 8,450,996, the state processor 950 can also include a noise measurement module 955, which can be the same as or similar to one of the noise measurement modules 190, 192 of FIG. 2.

Referring now to FIGS. 10 and 11, graphs are similar to FIGS. 7 and 7A of U.S. Pat. No. 8,450,996, and are described more fully therein. A sine wave 1072 is representative of the DDIFF of MIFF signals of FIG. 9.

In FIG. 10, a graph 1070 has a vertical axis with units of voltage in volts and a horizontal axis with units in arbitrary units of time. A signal 1072 is representative of a DIFF signal, for example, one of the R_DIFF signal 808a or the L_DIFF signal 824a of FIG. 8. The signal 1072 is also representative of a DDIFF signal, for example, one of the R_DDIFF signal 810a or the L_DDIFF signal 826a of FIG. 8, but in analog form. The signal 1072 can also be representative of the IDDIFF signal 954a of FIG. 9.

The signal 1072 passes through a plurality of states, identified as STATE0 to STATE15, of which states 1074a, 1074b are representative. Each state is indicative of a range of values, which, in relation to a DIFF signal (an analog signal), is indicative of an analog range of values, and which, in relation to a DDIFF signal (a digital signal), is indicative of a digital range of values, and which, in relation to an MIFF signal (a digital signal), is also indicative of a digital range of values. The digital ranges of values, in turn, are indicative of the analog ranges of values of the DIFF signal.

Exemplary ranges of values (in percentages of peak to peak range of the DIFF signal, DDIFF signal, or IDDIFF signal) associated with STATE0 to STATE15 are identified as element 980b in FIG. 9.

A state signal 1094 is representative of states that the DIFF signal falls into with time, which is the same as or similar to the STATE_SM signal 974a of FIG. 9. Thus, the DIFF signal 1072 as shown, at some times is in STATE0, at other times in STATE1, and so on. It will be understood that at the positive peak of the DIFF signal 1072, STATE15, is achieved and identified as element 1094a. The DIFF signal 1072 can continue above the line at STATE15 1094a, and the DIFF signal 1072 is still within the STATE15 1094a, until the DIFF signal drops below STATE15 1094a.

A signal 1076 having regions 1076a, 1076b is representative of the PPEAK signal 958a of FIG. 9. A signal 1078, including regions 1078a, 1078b is representative of the NPEAK signal 960a of FIG. 9. The PPEAK signal 1076 generally holds a value (subject to change) representative of an amplitude of a positive peak of the DIFF signal 1072. The NPEAK signal 1078 generally holds a value (subject to change) representative of an amplitude of a negative peak of the DIFF signal 1072.

The regions 1076a, 1076b are representative of times that the PPEAK signal 1076 counts or otherwise transitions downward to reacquire the DIFF signal 1072, then counts or otherwise transitions upward again to acquire the positive peak of the DIFF signal 1072, by way of operation of the logic 956 and comparator 964 of FIG. 9. Similarly, the regions 1078a, 1078b are representative of times that the NPEAK signal 1078 counts or otherwise transitions upward to reacquire the DIFF signal 1072, then counts or otherwise transitions downward again to acquire the negative peak of the DIFF signal 1072, by way of operation of the logic 962 and comparator 966 of FIG. 9.

Points 1080a, 1080b are indicative of the DIFF signal transitioning from the tenth state, STATE10 to the eleventh state, STATE11. Points 1082a, 1082b are indicative of the DIFF signal transitioning from the fifth state, STATE5, to the fourth state, STATE4.

It will be apparent that the start of the regions 1076a, 1076b are coincident with the points 1080a, 1080b, respectively. It will also be apparent that the start of the regions 1078a, 1078b are coincident with the points 1082a, 1082b, respectively. It will become apparent from discussion below in conjunction with FIG. 11, that the points 1080a, 1080b, 1082a, 1082b, are also coincident with transitions of a POSCOMP signal, for example, the POSCOMP signal 982a of FIG. 9.

Points 1084a, 1084b are indicative of the DIFF signal changing states from STATE15 to four states below STATE15, i.e., a change to STATE 11, represented by a state difference 1090. Points 1086a, 1086b are indicative of the DIFF signal changing from STATE0 to a state that is four states above STATE0, i.e., a change to STATE 4, represented by a state difference 1088.

It will become apparent from discussion below in conjunction with FIG. 10, that the points 1084a, 1084b, 1086a, 1086b are also coincident with transitions of a POSCOMP_PK signal, for example, the POSCOMP_PK signal 978 of FIG. 9.

Some state chatter (inappropriate back and forth state transitions), typified by state chatter 1092, can be present during state transitions. State transition chatter is associated with the STATE_SM signal 974a of FIG. 9. The state transition chatter is essentially reduced or eliminated by the state peak logic module 976 of FIG. 9 to result in the STATE_PEAK signal 976a of FIG. 9 with reduced state chatter or with no state chatter.

Referring now to FIG. 11, a graph 1100 has a vertical axis with units of voltage in volts and a horizontal axis with arbitrary units of time, aligned in time with the horizontal axis of FIG. 10.

A signal 1102 is representative of the POSCOMP signal 982a of FIG. 9. As described above, transitions 1104a,1104b and 1106a, 1106b of the POSCOMP signal 1102 are coincident with, and result from (by way of the decoder 982 of FIG. 9), the state transitions and associated points 1080a, 1080b, and 1082a, 1082b of FIG. 10.

A signal 1108, shown in phantom lines, is representative of the POSCOMP_PK signal 978 of FIG. 10. As described above, transitions 1110a, 1110b and 1112a, 1112b of the POSCOMP_PK signal 1108 are coincident with, and result from the state transitions and associated points 1084a, 1084b, and 1086a, 1086b of FIG. 10.

By operation of the state processor of FIG. 9, a plurality of states or amplitude ranges of the DIFF or IDIFF signal are identified, here, sixteen states labeled STATE0-STATE15.

In other embodiments, there can be more than or fewer than sixteen states. For example, in some embodiments, there are 1024, 2048, or 4096 states. In other embodiments, the number of states can be a value that is not divisible by two.

In a particular cycle of the DIFF or IDIFF signal 1072 (FIG. 10), a first upper state value 1080a and a first lower state value 1082a operate essentially as thresholds and are used to identify where edges of a particular output signal, referred to as a POSCOMP signal 1102, take place. Similarly, in a particular cycle of the DIFF or IDIFF signal 1072, a second upper state value 1084a and a second lower state value 1086a operate essentially as other thresholds and are used to identify where edges of another particular output signal, referred to as a POSCOMP_PK signal 1108, take place.

It will be understood that, in the same way that threshold values described above in conjunction with FIGS. 1-7 can be at particular percentages of a peak-to-peak amplitude range of the DIFF signal, here state values can similarly be at particular percentages of a peak-to-peak amplitude range of the DIFF or MIFF signal 1072. And also similarly, if the DIFF or IDIFF signal 1072 becomes too small, the first state values, e.g., 1080*a*, 1082*a*, and the second state values, e.g., 1084*a*, 1086*a* can be set such that their respective separations do not go below a minimum value, which is either a predetermined value, or which is determined in accordance with the measured system noise, for example, system noise measured by the noise measurement processor 955 of FIG. 9.

The state values of FIG. 10 are essentially threshold values, and thus, the state values may be referred to as threshold values herein.

Figure 12:
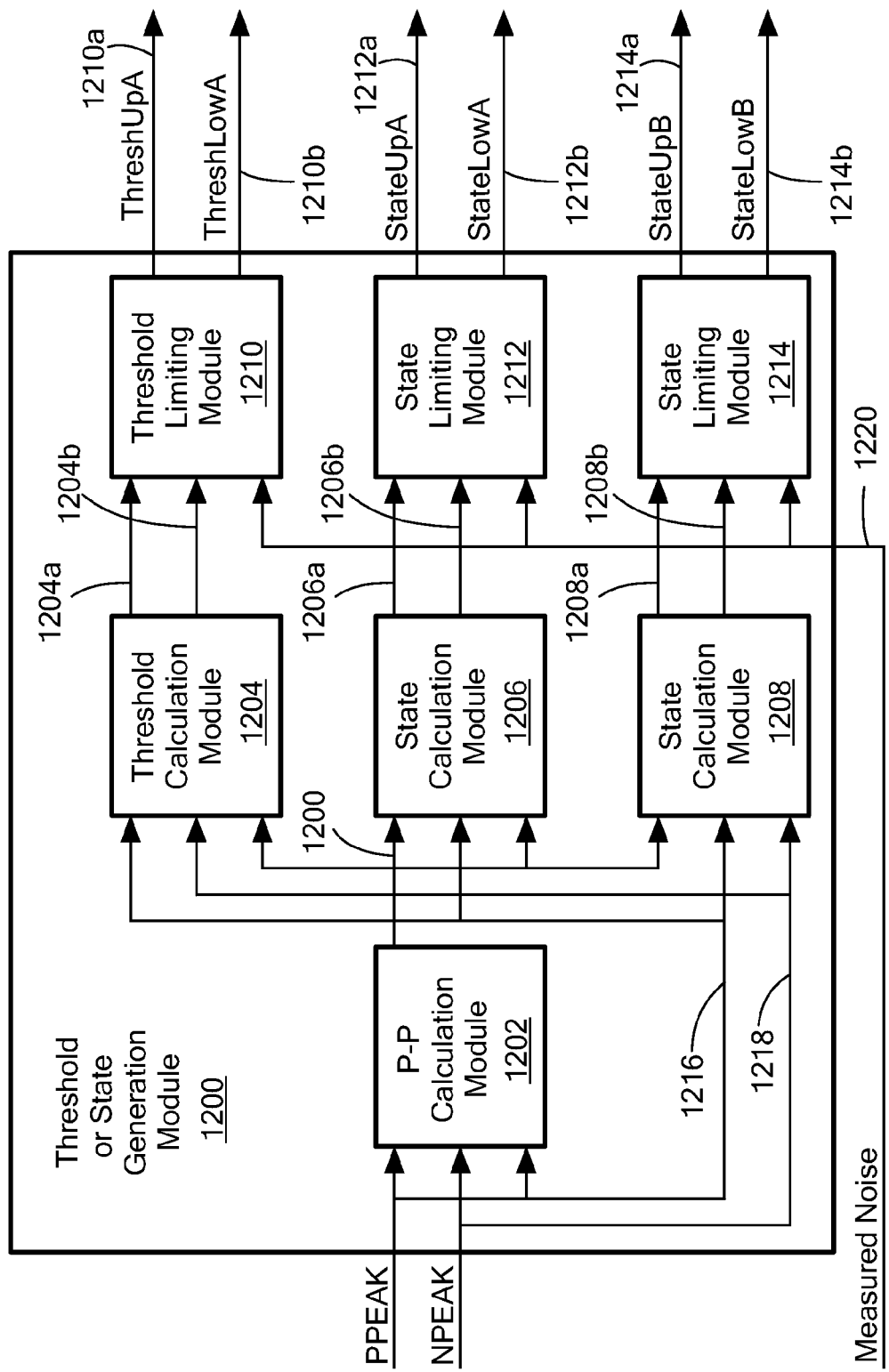
FIG. 12 is a block diagram of a threshold or state generation module as may be used in the state processor of FIG. 9.

Referring now to FIG. 12, a threshold or state generation module 1200 can be the same as or similar to the threshold or state generation module 957 of FIG. 9. The threshold or state generation module 1200 can include a peak-to-peak (PP) calculation module 1202, which can be the same as or similar to the PP calculation modules 502, 602 described above in conjunction with FIGS. 5 and 6.

The threshold or state generation module 1200 can include a threshold calculation module 1204 and/or a first state calculation module 1206 and a second state calculation module 1208. The threshold calculation module 1204 operates in the same way or in a similar way as a threshold calculation module 504, 506 described above in conjunction with FIG. 5. A threshold limiting module 1210 operates in the same way or in a similar way as the threshold limiting module 508 described above in conjunction with FIG. 5.

The first state calculation module 1206 operates to generate a first pair of state values 1206*a*, 1206*b*, for example, a pair of state values represented by state values 1080*a* and 1082*a* of FIG. 10. The state values 1206*a*, 1206*b* are received by a first state limiting module 1212, which, in the same way as threshold limiting described above, limits minimum separation between the two state values 1080*a*, 1082*a* of FIG. 10, or, more precisely, limits an equivalent voltage (or digital count) separation (or difference) between the state values 1080*a*, 1082*a*, as described more fully below. The limiting can be performed in accordance with a predetermined minimum value, or, in other embodiments the limiting can be performed in accordance with a measured value of the system noise 1220, as may be measured, for example, by the noise measurement module 955 of FIG. 9.

The second state calculation module 1208 operates to generate a second pair of state values 1208*a*, 1208*b*, for example, a pair of state values represented by state values 1084*a* and 1086*a* of FIG. 10. The state values are received by a second state limiting module 1214, which, in the same way as threshold limiting described above, limits minimum separation between the two state values 1084*a*, 1086*a* of FIG. 10, or, more precisely, limits an equivalent voltage (or digital count) separation (or difference) between the state values 1084*a*, 1086*a*, as described more fully below. The limiting can be performed in accordance with a predetermined minimum value, or, in other embodiments the limiting can be performed in accordance with a measured value of the system noise 1220, as may be measured, for example, by the noise measurement module 955 of FIG. 9.

A process that can be used by the state calculation modules 1206, 1208 and by the state limiting modules 1212, 1214 is described below in conjunction with FIG. 13.

A process used by the threshold calculation module 1204 and by the threshold limiting module 1210 of FIG. 12 can be similar to the process described above in conjunction with FIG. 7. The process is further described below.

Referring now to FIG. 13, a process is similar to the process of FIG. 7 and operates in a similar way. However, thresholds, i.e., threshold values in FIG. 7 have been replaced in FIG. 13 by states, i.e., state values.

The process can be used by the threshold or state generation module 957 of FIG. 9, and by the first and second state calculation modules 1206, 1208 of FIG. 12.

At block 1302, positive and negative peaks of a DIFF signal are identified and corresponding values are generated. The values correspond to the above-described PPEAK and NPEAK values 958*a*, 960*a* of FIG. 9, respectively.

At block 1304, a peak-to-peak amplitude of the DIFF signal is calculated, for example by the P-P calculation module 1202 of FIG. 12.

At block 1306, using the PPEAK value, the NPEAK value, and the calculated P-P value, two sets of upper and lower states are calculated, of which the state pairs 380*a*, 382*a*, and 384*a*, 386*a* are representative, by way of the first and second state calculation modules 1206, 1208 of FIG. 12. In some embodiments, the first two states are at about sixty percent and about forty percent of the peak-to-peak value and symmetrical about a center value between the PPEAAK and NPEAK values and the second two states are at about seventy and thirty percent of the peak-to-peak value.

At block 1308, two equivalent voltage differences are calculated for the above two state pairs. The equivalent voltage differences are calculated, for example, by the two state limiting modules 1212, 1214 of FIG. 12, between the above-described calculated threshold values.

Referring briefly to FIG. 10, it should be understood that for smaller and smaller amplitudes of the DIFF signal 1072, the DIFF signal 1072 continues to occupy all of the available states, here STATE0 to STATE15. This is unlike the description of FIG. 4. Thus, in order to have the same effect as that shown in FIG. 4, at some particular peak-to-peak amplitude of the DIFF signal 1072 of FIG. 10, the states used to cause state transitions of the POSCOMP signal 1102 and POSCOMP_PK signal 1108 must move outward, in order to maintain fixed equivalent voltage levels of the state value pairs.

Returning again to FIG. 13, at decision block 1310, if the differences of the equivalent voltage levels are greater than either a predetermined or a measured (see, e.g., noise measurement module 955 of FIG. 9) level of the system noise, then, at block 1314, the upper and lower states of the pairs of states are set to be the calculated states generated at block 1306, e.g., the state values 1080*a*, 1082*a* and 1086*a*, 1084*a* of FIG. 10.

On the other hand, at the decision block 1308, if the differences of the equivalent voltage levels are not greater than either a predetermined or a measured level of the system noise, then, at block 1312, the upper and lower states of the pairs of states are moved outwards in accordance with a predetermined equivalent voltage difference from the noise and centered between the states of the positive and negative peaks of the DIFF signal 1072 of FIG. 10.

The threshold calculation module 1204 and the threshold limiting module 1210 of FIG. 12 can use a process similar to the process of FIG. 7. However, here, the digital threshold generator 968 of FIG. 9 can use output signals 1210*a*, 1210*b* of the threshold limiting module 1210 of FIG. 12 to essentially change positions of the states (horizontal dashed lines) of FIG. 10, in order to achieve an effect similar to the movement of the state value pairs 1080a, 1082a, and 1084a, 1086a described above.

Figure 14:
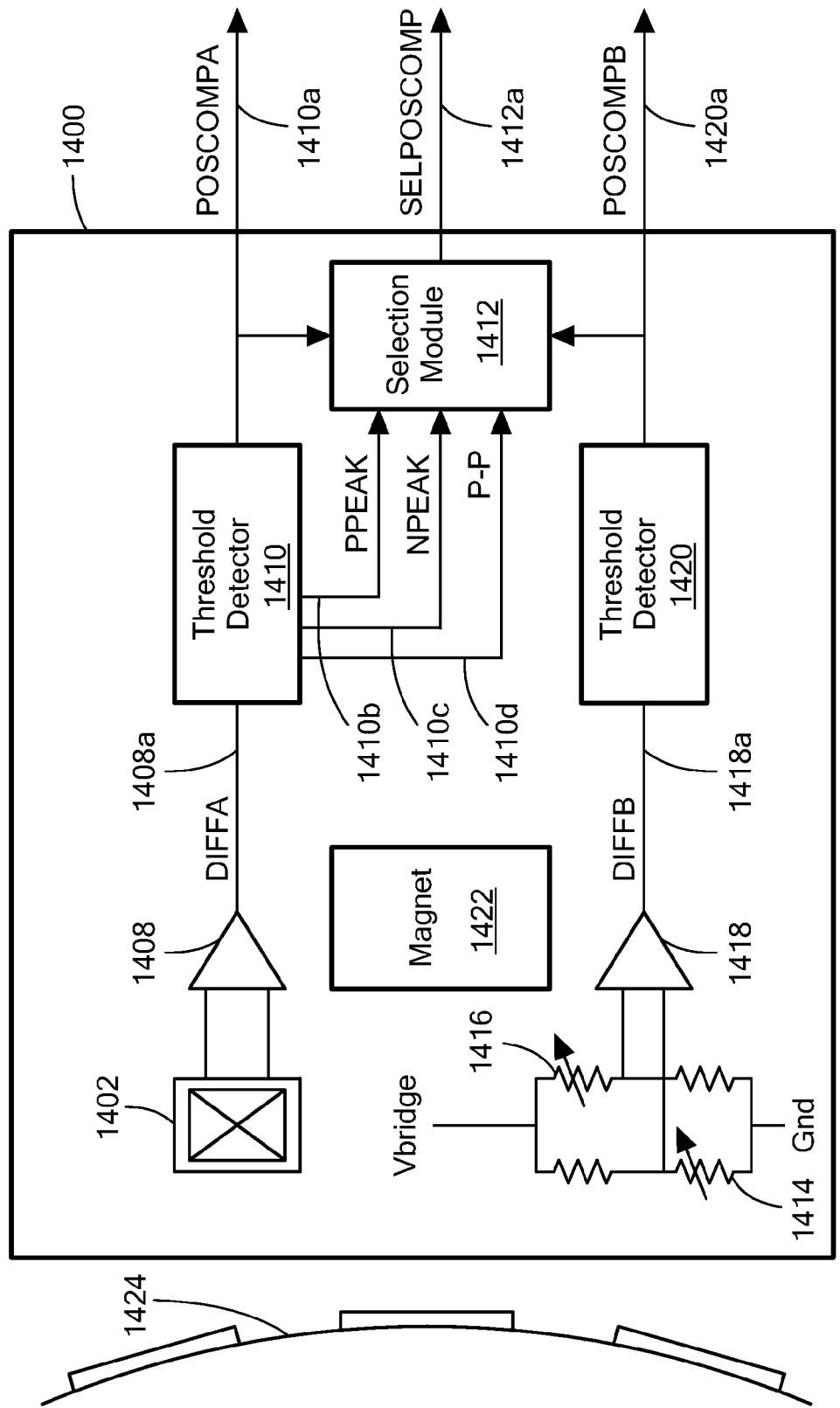
FIG. 14 is a block diagram showing an example of another magnetic field sensor that has threshold detectors and a selection module.

Referring now to FIG. 14, another exemplary magnetic field sensor can include a first circuit channel having a Hall effect element 1402, a magnetoresistance circuit channel having one or more magnetoresistance element, e.g., 1414, 1416, or both. Taking a two channel embodiment, the channels can generate respective magnetic field signals, e.g., DIFF signals 1408a, 1418a. The two channels can include respective threshold detectors 1410, 1420, which can be the same as or similar to the rotation detector 100 of with FIG. 2, excluding the peak detector portion (or alternatively, a state detector, which can be the same as or similar to the state processor 950 of FIG. 9). Thus the threshold detectors 1410, 1420 can include the noise measurement modules 190, 192 and the threshold generation modules 132, 174 of FIG. 2 or the noise measurement module 955 and the threshold or state generation module 957 of FIG. 9

The magnetic field sensor 1400 can generate a POSCOMPA signal 1410a and/or a POSCOMPB signal 1420a. These signals can be two state digital signals described above in conjunction with FIGS. 2, 5, 6, 9, and 12, which can be indicative of passing teeth of a ferromagnetic object or gear 1424. To this end, the magnetic field sensor 1400 can include or be disposed proximate to a magnet 1422 in a back-biased arrangement.

In some embodiments, the magnetic field sensor can include a selection module 1412 coupled to receive signals (for example, a PPEAK signal 1410b and an NPEAK signal 1410c representative of positive and negative peak of the DIFFA signal 1408a, and/or a peak-to-peak (P-P signal 1410d representative of a peak to peak value of the DIFFA signal 1408a) from which it can be determined by the selection module 1412 how big a sensed magnetic field is.

In some embodiments, if the sensed magnetic field is below a threshold sensed magnetic field, the SELPOSCOMP t signal 1412a is the same as the POSCOMPB signal. If the sensed magnetic field is above the threshold sensed magnetic field, the SELPOSCOMP signal 1412a can be the same as the POSCOMPA signal 1410a. The reverse arrangement is also possible.

Because magnetoresistance elements tend have larger sensitivities than Hall elements (i.e., the two magnetic field sensing elements have two different sensitivities), this arrangement, having the two channels, can result in a magnetic field sensor with a greater operating range (i.e., range of sensed magnetic field) than for a one channel magnetic field sensor that has only one of the indicated channels. The two ranges of sensed magnetic fields provided by the two channels need not overlap or intersect.

Arrangements having only one of the two indicated channels are possible, in which arrangements, there is no selection module. Arrangements having no magnet 1422 are also possible, in which case the magnetic field sensor can be responsive to a ring magnet or the like.

Having described preferred embodiments of the invention it will now become apparent to those of ordinary skill in the art that other embodiments incorporating these concepts may be used. Additionally, the software included as part of the invention may be embodied in a computer program product that includes a computer-readable storage medium. For example, such a computer-readable storage medium can include a computer-readable memory device, such as a hard drive device, a RAM, a ROM, a CD-ROM, a DVD-ROM, or a computer diskette, having computer-readable program code segments stored thereon. The term computer-readable storage medium does not include a transitory signal. As used herein, the term "non-transitory" does not exclude computer readable storage media in which data may be temporarily stored. In contrast, a computer-readable transmission medium can include a communications link, either optical, wired, or wireless, having program code segments carried thereon as digital or analog signals. Accordingly, it is submitted that that the invention should not be limited to the described embodiments but rather should be limited only by the spirit and scope of the appended claims. All publications and references cited herein are expressly incorporated herein by reference in their entirety.

What is claimed is:

1. A magnetic field sensor, comprising:
   at least one magnetic field sensing element configured to generate a magnetic field signal influenced by a ferromagnetic object;
   peak finding circuitry operable to identify at least one of a positive peak value or a negative peak value of the magnetic field signal;
   a threshold generation module coupled to receive the at least one of the positive peak value or the negative peak value, wherein the threshold generation module comprises:
      a peak-to-peak calculation module operable to determine a peak-to-peak value by using the at least one of the positive peak value or the negative peak value;
      a threshold calculation module operable to determine an upper threshold value and a lower threshold value based on the peak-to-peak value, wherein the upper threshold value is a first predetermined percentage of the peak-to-peak value and the lower threshold value is a second lower predetermined percentage of the peak-to-peak value; and
      a threshold limiting module operable to identify a difference between the upper threshold value and the lower threshold value, and, if the difference is smaller than a minimum separation value based on a function of an RMS noise level associated with the magnetic field signal, operable to set the difference between the upper threshold value and the lower threshold value to a corrected difference value.

2. The magnetic field sensor of claim 1, wherein the corrected difference value is selected based upon an expected, but not measured, noise of the magnetic field signal.

3. The magnetic field sensor of claim 1, wherein the magnetic field sensor further comprises a noise measurement module operable to measure a noise of the magnetic field signal, wherein the corrected difference value is selected based upon the measured noise of the magnetic field signal.

4. The magnetic field sensor of claim 1, wherein the at least one magnetic field sensing element comprises a Hall element.

5. The magnetic field sensor of claim 1, wherein the at least one magnetic field sensing element comprises a magnetoresistance element.

6. The magnetic field sensor of claim 1, wherein the at least one magnetic field sensing element comprises a first magnetic field sensing element operable to generate a first magnetic field signal and a second magnetic field sensing element operable to generate a second magnetic field signal, the magnetic field sensor further comprising:

a selection module coupled to receive at least one of the positive peak value, the negative peak value, or the peak-to-peak value, operable to identify an amplitude of a magnetic field sensed by at least one of the first or second magnetic field sensing elements, operable to select one of a first signal indicative of the first magnetic field signal or a second signal indicative of the second magnetic field signal based upon the identified amplitude, and operable to generate a selected signal as the selected one of the first or second signals based upon the selection.

7. The magnetic field sensor of claim 6, wherein the first and second magnetic field sensing elements have first and second different sensitivities to a magnetic field, and wherein the magnetic field sensor has first and second different operating ranges in response to the first and second different sensitivities.

8. A method of sensing a magnetic field, comprising:
generating a magnetic field signal influenced by a ferromagnetic object with at least one magnetic field sensing element;
identifying at least one of a positive peak value or a negative peak value of the magnetic field signal;
determining a peak-to-peak value by using the at least one of the positive peak value or the negative peak value;
determining an upper threshold value and a lower threshold based on the peak-to-peak value, wherein the upper threshold value is a first predetermined percentage of the peak-to-peak value and the lower threshold value is a second lower predetermined percentage of the peak-to-peak value;
identifying a difference between the upper threshold value and the lower threshold value; and
if the difference is smaller than a minimum separation value based on a function of an RMS noise level associated with the magnetic field signal, setting the difference between the upper threshold value and the lower threshold value to a corrected difference value.

9. The method of claim 8, wherein the corrected difference value is selected based upon an expected, but not measured, noise of the magnetic field signal.

10. The method of claim 8, further comprising:
measuring a noise of the magnetic field signal, wherein the corrected difference value is selected based upon the measured noise of the magnetic field signal.

11. The method of claim 8, wherein the at least one magnetic field sensing element comprises a Hall element.

12. The method of claim 8, wherein the at least one magnetic field sensing element comprises a magnetoresistance element.

13. The method of claim 8, wherein the at least one magnetic field sensing element comprises a first magnetic field sensing element operable to generate a first magnetic field signal and a second magnetic field sensing element operable to generate a second magnetic field signal, the magnetic field sensor, the method further comprising:
identifying an amplitude of a magnetic field sensed by at least one of the first or second magnetic field sensing elements using at least one of the positive peak value, the negative peak value, or the peak-to-peak value;
selecting one of a first signal indicative of the first magnetic field signal or a second signal indicative of the second magnetic field signal based upon the identified amplitude; and
generating a selected signal as the selected one of the first or second signal based upon the selection.

14. The method of claim 13, wherein the first and second magnetic field sensing elements have first and second different sensitivities to a magnetic field, and wherein the magnetic field sensor has first and second different operating ranges in response to the first and second different sensitivities.

15. A non-transitory computer-readable storage medium having computer readable code thereon, the medium comprising:
instructions for determining a peak-to-peak value by using the at least one of a positive peak value or the negative peak value of a magnetic field signal generated by at least one magnetic field sensing element;
instructions for determining an upper threshold value and a lower threshold based on the peak-to-peak value, wherein the upper threshold value is a first predetermined percentage of the peak-to-peak value and the lower threshold value is a second lower predetermined percentage of the peak-to-peak value;
instructions for identifying a difference between the upper threshold value and the lower threshold value; and
instructions for, if the difference is smaller than minimum separation value based on a function of an RMS noise level associated with the magnetic field signal, setting the difference between the upper threshold value and the lower threshold value to a corrected difference value.

16. The non-transitory computer-readable storage medium of claim 15, wherein the corrected difference value is selected based upon an expected, but not measured, noise of the magnetic field signal.

17. The non-transitory computer-readable storage medium of claim 15, further comprising:
instructions for measuring a noise of the magnetic field signal, wherein the corrected difference value is selected based upon the measured noise of the magnetic field signal.

18. The non-transitory computer-readable storage medium of claim 15, wherein the at least one magnetic field sensing element comprises a Hall element.

19. The non-transitory computer-readable storage medium of claim 15, wherein the at least one magnetic field sensing element comprises a magnetoresistance element.

20. The non-transitory computer-readable storage medium of claim 15, wherein the at least one magnetic field sensing element comprises a first magnetic field sensing element operable to generate a first magnetic field signal and a second magnetic field sensing element operable to generate a second magnetic field signal, the magnetic field sensor, the non-transitory computer-readable storage further comprising:
instructions for identifying an amplitude of a magnetic field sensed by at least one of the first or second magnetic field sensing elements using at least one of the positive peak value, the negative peak value, or the peak-to-peak value;
instructions for selecting one of a first signal indicative of the first magnetic field signal or a second signal indicative of the second magnetic field signal based upon the identified amplitude; and
instructions for generating a selected signal as the selected one of the first or second signal based upon the selection.

21. The non-transitory computer-readable storage medium of claim 20, wherein the first and second magnetic field sensing elements have first and second different sensitivities to a magnetic field, and wherein the magnetic field sensor has first and second different operating ranges in response to the first and second different sensitivities.

* * * * *

UNITED STATES PATENT AND TRADEMARK OFFICE
CERTIFICATE OF CORRECTION

PATENT NO. : 9,778,326 B2
APPLICATION NO. : 14/626963
DATED : October 3, 2017
INVENTOR(S) : Michael Chen et al.

Page 1 of 2

It is certified that error appears in the above-identified patent and that said Letters Patent is hereby corrected as shown below:

Column 7, Line 20, delete "peak referenced" and replace with --peak-referenced--.

Column 7, Line 55, delete "RUFF" and replace with --RDIFF--.

Column 8, Line 24, delete "14$b$ and 14$c$" and replace with --14$b$ and 14$c$,--.

Column 8, Line 46, delete "No. 7,772,838" and replace with --No. 7,772,838.--.

Column 11, Line 46, delete "133$e$" and replace with --133$c$.--.

Column 14, Line 21, delete "for example for example" and replace with --for example--.

Column 14, Line 45, delete "PP" and replace with --P-P--.

Column 20, Line 63, delete "23 million" and replace with --2.7 million--.

Column 22, Line 36, delete "peak-to-peal" and replace with --peak-to-peak--.

Column 22, Line 51, delete "MIFF" and replace with --IDIFF--.

Column 23, Line 12, delete "of MIFF" and replace with --or IDIFF--.

Column 23, Line 29, delete "of MIFF" and replace with --or IDIFF--.

Column 25, Line 9, delete "MIFF" and replace with --IDIFF--.

Column 25, Line 26, delete "PP" and replace with --P-P--.

Signed and Sealed this
Eighth Day of January, 2019

Andrei Iancu
*Director of the United States Patent and Trademark Office*

CERTIFICATE OF CORRECTION (continued)
U.S. Pat. No. 9,778,326 B2

Column 25, Line 27, delete "PP" and replace with --P-P--.

Column 26, Line 29, delete "PPEAAK" and replace with --PPEAK--.